(12) United States Patent
Kravets et al.

(10) Patent No.: US 9,389,258 B2
(45) Date of Patent: Jul. 12, 2016

(54) SLIM SENSOR DESIGN WITH MINIMUM TAIL EFFECT

(71) Applicant: Parade Technologies, Ltd., Santa Clara, CA (US)

(72) Inventors: Igor Kravets, Lviv (UA); Alexandre Gourevitch, San Jose, CA (US); Oleksandr Karpin, Lviv (UA); Oleksandr Hoshtanar, Lviv (UA); Massoud Badaye, Sunnyvale, CA (US)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 0 days.

(21) Appl. No.: 14/318,354

(22) Filed: Jun. 27, 2014

(65) Prior Publication Data

US 2014/0313169 A1    Oct. 23, 2014

Related U.S. Application Data

(63) Continuation-in-part of application No. 14/229,524, filed on Mar. 28, 2014, which is a continuation-in-part of application No. 13/405,071, filed on Feb. 24, 2012, application No. 14/318,354, which is a (Continued)

(51) Int. Cl.
    *G06F 3/041*      (2006.01)
    *G01R 27/26*      (2006.01)
    (Continued)

(52) U.S. Cl.
    CPC ............ *G01R 27/2605* (2013.01); *G06F 3/044* (2013.01); *H03K 17/962* (2013.01); *H03K 2017/9602* (2013.01)

(58) Field of Classification Search
    CPC ....... G06F 3/041; G06F 3/0418; G06F 3/044; G06F 3/047; G06F 2203/04107; G06F 2203/04112; G06F 2203/04113; H03K 2017/9602; H03K 17/962; G01R 27/2605

USPC .................. 345/156–173; 178/18.01–20.04; 174/250
    See application file for complete search history.

(56) References Cited

U.S. PATENT DOCUMENTS

| 4,233,522 A | 11/1980 | Grummer et al. |
| 4,707,845 A | 11/1987 | Krein et al. |

(Continued)

FOREIGN PATENT DOCUMENTS

| JP | 2010205177 A | 9/2010 |
| WO | 2010117882 A | 10/2010 |

(Continued)

OTHER PUBLICATIONS

U.S. Appl. No. 13/248,776: "Single Layer Touch Sensor," Massoud Badaye, filed Sep. 29, 2011; 36 pages.

(Continued)

*Primary Examiner* — Amr Awad
*Assistant Examiner* — Roberto Flores
(74) *Attorney, Agent, or Firm* — Morgan, Lewis & Bockius LLP

(57) ABSTRACT

Techniques for designs of single-layer touch sensors are described herein. In an example embodiment, a device comprises a sensor array. The sensor array comprises first plurality of electrodes and second plurality of electrodes that are interleaved without intersecting each other within a touch-sensing area in a single layer on a substrate of the sensor array. A first electrode (of the first or second plurality) comprises at least two shaped portions. The two shaped portions may be disposed across at least a portion of a given second electrode from each other, or may be disposed between two or more portions of the given second electrode. The two shaped portions of the first electrode are routed in different directions on the substrate and are coupled to each other outside of the touch-sensing area of the sensor array.

18 Claims, 16 Drawing Sheets

Related U.S. Application Data continuation-in-part of application No. 14/038,423, filed on Sep. 26, 2013, now Pat. No. 8,866,491, which is a continuation-in-part of application No. 13/800,468, filed on Mar. 13, 2013, now Pat. No. 8,866,490, said application No. 14/038,423 is a continuation-in-part of application No. 13/405,071.

(60) Provisional application No. 61/941,086, filed on Feb. 18, 2014, provisional application No. 61/446,178, filed on Feb. 24, 2011, provisional application No. 61/559,590, filed on Nov. 14, 2011, provisional application No. 61/876,154, filed on Sep. 10, 2013, provisional application No. 61/785,131, filed on Mar. 14, 2013, provisional application No. 61/754,028, filed on Jan. 18, 2013.

(51) Int. Cl.
*G06F 3/044* (2006.01)
*H03K 17/96* (2006.01)

(56) References Cited

U.S. PATENT DOCUMENTS

| | | | |
|---|---|---|---|
| 7,129,935 B2 | 10/2006 | Mackey | |
| 7,202,855 B2 | 4/2007 | Shigetaka et al. | |
| 7,202,859 B1 | 4/2007 | Speck et al. | |
| 7,265,809 B2 | 9/2007 | Dunn et al. | |
| 7,280,173 B2 | 10/2007 | Kamijo | |
| 7,382,139 B2 | 6/2008 | Mackey | |
| 7,423,635 B2 | 9/2008 | Taylor et al. | |
| 7,439,962 B2 | 10/2008 | Reynolds et al. | |
| 7,499,039 B2 | 3/2009 | Roberts | |
| 7,548,073 B2 * | 6/2009 | Mackey | G01D 5/2415 324/660 |
| 7,821,425 B2 | 10/2010 | Philipp | |
| 7,973,771 B2 | 7/2011 | Geaghan | |
| 8,243,027 B2 | 8/2012 | Hotelling et al. | |
| 8,274,488 B2 | 9/2012 | Bae | |
| 8,294,687 B1 | 10/2012 | Ksondzyk | |
| 8,300,019 B2 * | 10/2012 | Elias et al. | 345/173 |
| 8,508,680 B2 | 8/2013 | Geaghan et al. | |
| 8,599,150 B2 | 12/2013 | Philpp | |
| 8,866,490 B1 | 10/2014 | Mandziy et al. | |
| 8,866,491 B2 | 10/2014 | Ksondzyk et al. | |
| 9,256,327 B2 * | 2/2016 | Salaverry | G06F 3/0416 |
| 2003/0210235 A1 | 11/2003 | Roberts | |
| 2004/0175257 A1 | 9/2004 | Pallas | |
| 2005/0270039 A1 * | 12/2005 | Mackey | G06F 3/044 324/660 |
| 2005/0270273 A1 | 12/2005 | Marten | |
| 2006/0097991 A1 | 5/2006 | Hotelling et al. | |
| 2006/0227115 A1 | 10/2006 | Fry | |
| 2007/0008299 A1 | 1/2007 | Hristov | |
| 2007/0074913 A1 | 4/2007 | Geaghan et al. | |
| 2007/0074914 A1 | 4/2007 | Geaghan et al. | |
| 2007/0132386 A1 | 6/2007 | Kim et al. | |
| 2007/0279395 A1 | 12/2007 | Philipp et al. | |
| 2008/0143683 A1 | 6/2008 | Hotelling | |
| 2008/0158181 A1 | 7/2008 | Hamblin et al. | |
| 2008/0246496 A1 | 10/2008 | Hristov et al. | |
| 2008/0264699 A1 | 10/2008 | Chang et al. | |
| 2009/0002337 A1 | 1/2009 | Chang | |
| 2009/0090694 A1 | 4/2009 | Hotelling et al. | |
| 2009/0159344 A1 | 6/2009 | Hotelling et al. | |
| 2009/0273577 A1 | 11/2009 | Chen et al. | |
| 2009/0314621 A1 | 12/2009 | Hotelling | |
| 2010/0013800 A1 | 1/2010 | Elias et al. | |
| 2010/0045614 A1 | 2/2010 | Gray et al. | |
| 2010/0059294 A1 | 3/2010 | Elias et al. | |
| 2010/0079401 A1 | 4/2010 | Staton | |
| 2010/0090979 A1 | 4/2010 | Bae | |
| 2010/0108409 A1 | 5/2010 | Tanaka et al. | |
| 2010/0144391 A1 | 6/2010 | Chang et al. | |
| 2010/0214260 A1 | 8/2010 | Tanaka et al. | |
| 2010/0220071 A1 | 9/2010 | Nishihara et al. | |
| 2010/0258360 A1 | 10/2010 | Yilmaz | |
| 2010/0289774 A1 | 11/2010 | Pan et al. | |
| 2010/0321326 A1 * | 12/2010 | Grunthaner | G06F 3/044 345/174 |
| 2010/0321331 A1 | 12/2010 | Oda et al. | |
| 2011/0012845 A1 | 1/2011 | Rothkopf et al. | |
| 2011/0018841 A1 | 1/2011 | Hristov | |
| 2011/0048812 A1 * | 3/2011 | Yilmaz | G06F 3/044 178/18.06 |
| 2011/0048813 A1 | 3/2011 | Yilmaz | |
| 2011/0102361 A1 | 5/2011 | Philipp | |
| 2011/0148785 A1 | 6/2011 | Oda et al. | |
| 2011/0170099 A1 | 7/2011 | Ko | |
| 2012/0050180 A1 | 3/2012 | King et al. | |
| 2012/0081324 A1 | 4/2012 | Philipp | |
| 2012/0098783 A1 | 4/2012 | Badaye et al. | |
| 2012/0162090 A1 | 6/2012 | Chang et al. | |
| 2012/0162144 A1 | 6/2012 | Faahraeus et al. | |
| 2012/0182251 A1 | 7/2012 | Krah | |
| 2012/0200530 A1 | 8/2012 | Wu et al. | |
| 2012/0262412 A1 | 10/2012 | Guard et al. | |
| 2013/0050105 A1 | 2/2013 | Lee et al. | |
| 2013/0069905 A1 | 3/2013 | Krah et al. | |
| 2013/0100054 A1 | 4/2013 | Philipp | |
| 2013/0127772 A1 | 5/2013 | Guard et al. | |
| 2013/0127775 A1 | 5/2013 | Yilmaz et al. | |
| 2013/0181943 A1 * | 7/2013 | Bulea | G06F 3/044 345/174 |
| 2013/0187704 A1 | 7/2013 | Edwards | |
| 2013/0207911 A1 | 8/2013 | Barton et al. | |
| 2013/0234974 A1 | 9/2013 | Guard | |
| 2013/0329347 A1 * | 12/2013 | Kuo | H03K 17/962 361/679.01 |
| 2014/0092036 A1 | 4/2014 | Lin et al. | |
| 2014/0192027 A1 | 7/2014 | Ksondzyk et al. | |

FOREIGN PATENT DOCUMENTS

| | | | |
|---|---|---|---|
| WO | WO2012/176639 A1 | 12/2012 | |
| WO | 2013179042 A | 12/2013 | |

OTHER PUBLICATIONS

U.S. Appl. No. 13/405,071: "Single Layer Touch Sensor," Massoud Badaye, filed Feb. 24, 2012; 64 pages.

Application No. PCT/US11/53916: "Single Layer Touch Sensor," filed on Sep. 29, 2011; 35 pages.

Fischer, Dirk, "Capacitive Touch Sensors: Application Fields, Technology Overview, and Implementation Example", Fujitsu Microelectronics Europe; Langen, Germany; v4, dated Jan. 12, 2010; 12 pages.

International Search Report for International Application No. PCT/US11/53916 dated Apr. 10, 2012; 3 pages.

International Search Report for International Application No. PCT/US12/26634 dated May 29, 2012; 2 pages.

USPTO Non-Final Rejection for U.S. Appl. No. 13/405,071 dated Jul. 21, 2014; 15 pages.

USPTO Non-Final Rejection for U.S. Appl. No. 13/528,644 dated Nov. 20, 2012; 6 pages.

USPTO Non-Final Rejection for U.S. Appl. No. 14/229,524 dated Jul. 29, 2014; 15 pages.

USPTO Notice of Allowance for U.S. Appl. No. 13/528,644 dated Jan. 25, 2013; 5 pages.

USPTO Notice of Allowance for U.S. Appl. No. 13/528,644 dated Apr. 23, 2013; 6 pages.

USPTO Notice of Allowance for U.S. Appl. No. 13/528,644 dated Jun. 7, 2013; 6 pages.

USPTO Requirement for Restriction/Election for U.S. Appl. No. 14/229,524 dated Jun. 10, 2014; 6 pages.

USPTO Requirement to Restriction for U.S. Appl. No. 13/405,071 dated Sep. 13, 2013; 5 pages.

USPTO Requirement to Restriction for U.S. Appl. No. 13/528,644 dated Aug. 21, 2012; 6 pages.

Written Opinion of the International Searching Authority for International Application No. PCT/US12/26634 mailed May 29, 2012; 5 pages.

(56) References Cited

OTHER PUBLICATIONS

Wu, Xiaoling et al., "Touchware: A Software-Based Technique for High-Resolution Multi-Touch Sensing Devices," Int. J. Ad Hoc and Ubiquitous Computing, vol. X, No. X, 200x; 13 pages.
U.S. Appl. No. 13/800,468, "Method and Apparatus for Eliminating Tail Effect in Touch Applications," Vasyl Mandziy, filed Mar. 13, 2013, 51 pgs.
U.S. Appl. No. 61/446,178, "Single-Layer Multi-Touch Sensor," Matt Badaye, filed Feb. 24, 2011, 6 pgs.
U.S. Appl. No. 61/559,590, "Single Layer Touch Sensor," Massoud Badaye, filed Nov. 14, 2011, 35 pgs.
U.S. Appl. No. 61/607,513, "Single Layer Multi-Touch Sensor," Matt Badaye, filed Mar. 6, 2012, 11 pgs.
Application No. PCT/US2011/053916, "Single Layer Touch Sensor," filed on Sep. 29, 2011, 35 pgs.
Badaye, Final Office Action, U.S. Appl. No. 13/405,071, Oct. 16, 2014, 22 pgs.
Badaye, Final Office Action, U.S. Appl. No. 13/405,071, Jul. 22, 2015, 21 pgs.
Badaye, Office Action, U.S. Appl. No. 13/528,739, Apr. 29, 2015, 19 pgs.
Badaye, Final Office Action, U.S. Appl. No. 13/528,739, Dec. 15, 2015, 19 pgs.
Gourevitch, Notice of Allowance, U.S. Appl. No. 14/229,524, Oct. 23, 2014, 16 pgs.
Goureviteh, Office Action, U.S. Appl. No. 14/229,524, May 28, 2015, 16 pgs.
Gourevitch, Final Office Action, U.S. Appl. No. 14/229,524, Jan. 14, 2016, 16 pgs.
International Search Report and Written Opinion, PCT/US2013/062331, dated Feb. 12, 2014, 6 pgs.
USPTO, Final Office Action, U.S. Appl. No. 13/800,468, dated May 22, 2014, 10 pgs.
USPTO, Office Action, U.S. Appl. No. 13/800,468, dated Jan. 21, 2014, 8 pgs.
USPTO, Notice of Allowance, U.S. Appl. No. 13/800,468, dated Sep. 12, 2014, 8 pgs.
USPTO, Final Office Action, U.S. Appl. No. 14/038,423, dated May 22, 2014, 11 pgs.
USPTO, Office Action, U.S. Appl. No. 14/038,423, dated Jan. 14, 2014, 9 pgs.
USPTO, Notice of Allowance, U.S. Appl. No. 14/038,423, dated Sep. 9, 2014, 9 pgs.

* cited by examiner

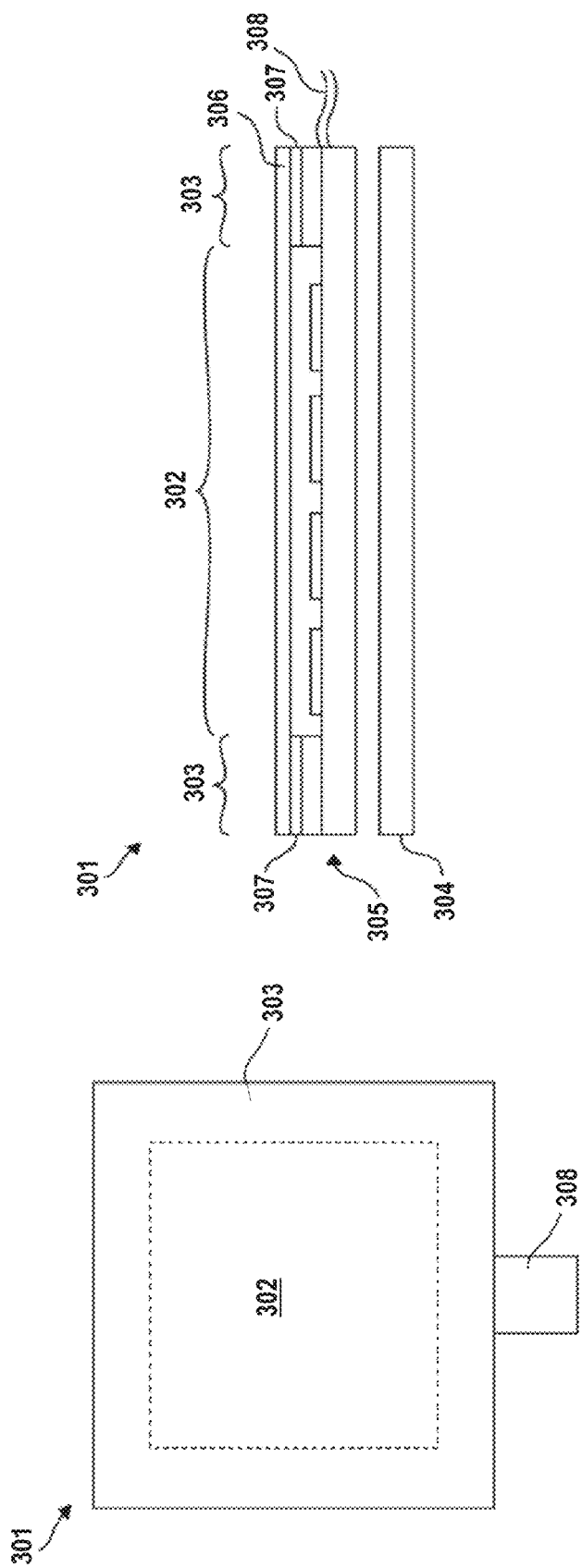

SLIM SENSOR DESIGN WITH MINIMUM TAIL EFFECT

PRIORITY

The present application claims the priority and benefit of U.S. Provisional Application No. 61/941,086, which was filed on Feb. 18, 2014 and which is incorporated by reference herein.

The present application also claims priority as a Continuation-In-Part of U.S. patent application Ser. No. 14/229,524, filed on Mar. 28, 2014, which claims priority from U.S. Provisional Application No. 61/876,154, filed on Sep. 10, 2013, and which also claims priority as a Continuation-In-Part of U.S. patent application Ser. No. 13/405,071, filed on Feb. 24, 2012, which in turn claims priority from U.S. Provisional Application No. 61/559,590, filed on Nov. 14, 2011, and from U.S. Provisional Application No. 61/446,178, filed on Feb. 24, 2011. All applications referenced in this paragraph are incorporated by reference herein.

The present application also claims priority as a Continuation-In-Part of U.S. application Ser. No. 14/038,423, filed on Sep. 26, 2013, which claims priority from U.S. Provisional Application No. 61/785,131, filed on Mar. 14, 2013, and which also: (1) claims priority as a continuation-in-part of U.S. patent application Ser. No. 13/800,468, filed on Mar. 13, 2013, which in turn claims priority from U.S. Provisional Application No. 61/754,028, filed on Jan. 18, 2013, and (2) claims priority as a Continuation-In-Part of U.S. patent application Ser. No. 13/405,071, filed on Feb. 24, 2012, which in turn claims priority from U.S. Provisional Application No. 61/559,590, filed on Nov. 14, 2011, and from U.S. Provisional Application No. 61/446,178, filed on Feb. 24, 2011. All applications referenced in this paragraph are incorporated by reference herein.

TECHNICAL FIELD

This disclosure generally relates to the field of touch-sensing devices.

BACKGROUND

Computing devices, such as notebook computers, personal digital assistants, mobile communication devices, portable entertainment devices (e.g., handheld video games, multimedia players, etc.), and set-top-boxes (e.g., digital cable boxes, digital video disc (DVD) players, etc.) may include user interface devices that facilitate interaction between a user and the computing device. One type of user interface device that has become common is a touch-sensing device or touch input device that operates by way of capacitive sensing. A touch-sensing device may be embodied as a touchscreen, touch-sensing pad, touch-sensing slider, or touch-sensing buttons, and may include a touch sensor comprising an array of capacitive sensor elements. Capacitive sensing typically involves scan operations that periodically measure changes in capacitance associated with the capacitive sensor elements to determine a presence, position, and/or movement of a conductive object (e.g., a stylus, a user's finger, etc.) relative to the touch sensor.

Touch sensors are an expensive part of a touch-sensing device or the user interface system thereof. One reason for the high manufacturing cost of touch sensors is that conventional sensors use either multiple layers of electrode materials formed on multiple substrates or a single substrate with a series of "jumpers" to form electrical connection between the individual electrode segments and insulate them from the other electrodes that intersect them. One way to reduce the high cost of touch sensors is to route the trace portions (or segments) of electrodes tightly together on the active area of a single substrate without the use of "jumpers". However, this type of sensor construction leads to increased capacitive cross-coupling between the electrodes (e.g., especially in response to a conductive object touch), thereby causing false touches, inaccuracy, and poor touch-response linearity, all of which limit the functionality of the touch-sensing device and/or lead to poor user experience.

BRIEF DESCRIPTION OF THE DRAWINGS

FIG. 3A illustrates a simplified plan view of a touch-sensing device according to an example embodiment.

FIG. 3B illustrates a cross-sectional view of the touch-sensing device in FIG. 3A.

DETAILED DESCRIPTION

Figure 1:
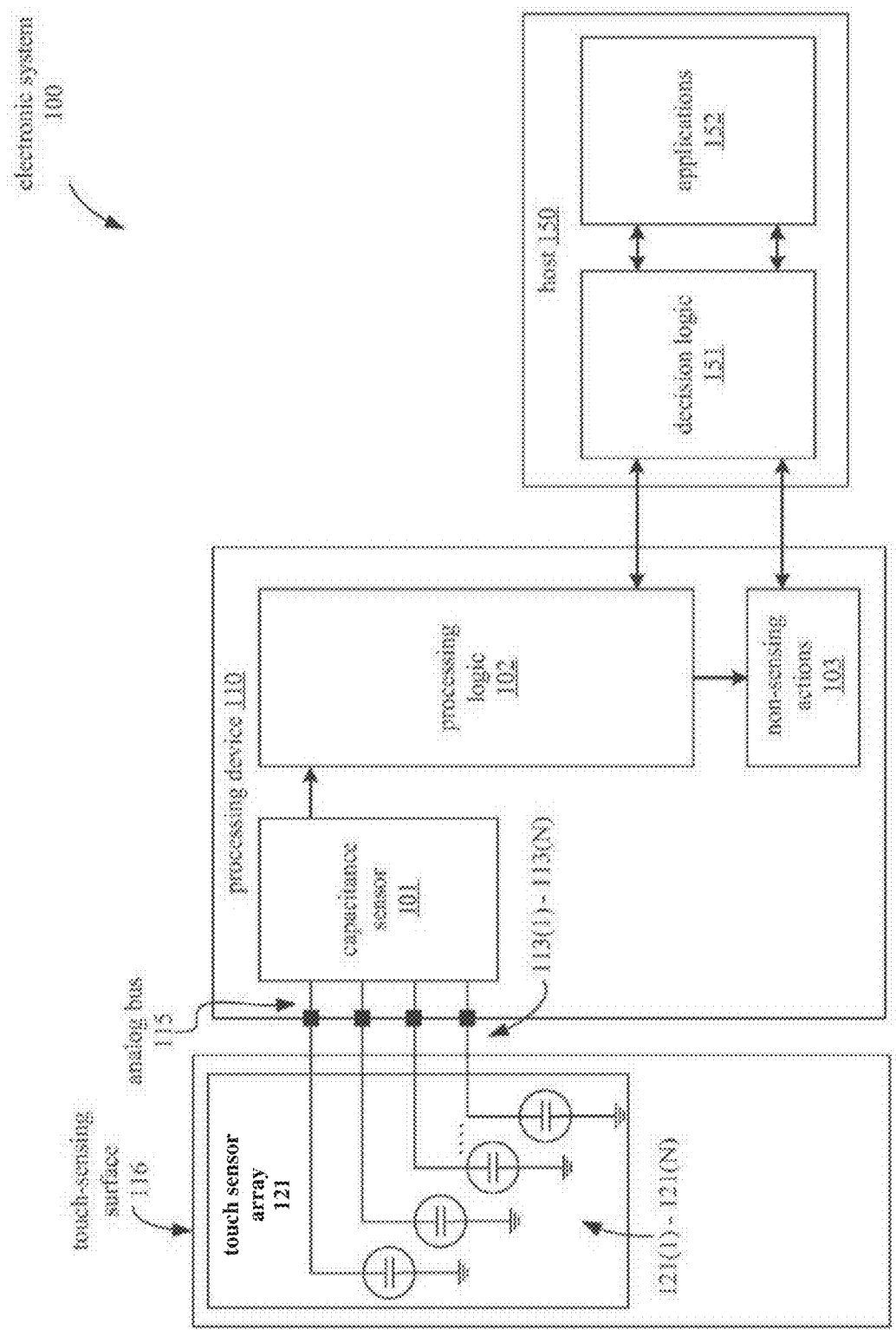
FIG. 1 is a block diagram illustrating an embodiment of an example electronic system that includes touch sensor components.

The following description sets forth numerous specific details such as examples of specific systems, components, methods, and so forth, in order to provide a good understanding of various embodiments of the techniques described herein for designs of single-layer touch sensors (e.g., such as touch sensors with Single-Layer Independent Multi-touch, or SLIM, electrode patterns) with minimum, easily correctable tail effects. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

Reference in the description to "an embodiment", "one embodiment", "an example embodiment", "some embodiments", and "various embodiments" means that a particular feature, structure, or characteristic described in connection with the embodiment(s) is included in at least one embodiment of the invention. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Overview

Described herein are various embodiments of techniques for designs of a touch sensor with mutual-capacitance and/or self-capacitance electrodes that are arranged in the same (e.g., single) layer of the substrate of the touch sensor. Unless expressly specified otherwise, "touch sensors" are also referred to herein as "sensor arrays", "touch sensor arrays", "touch panels", "touch sensor panels", and the like.

As used herein, "contact" refers to a physical touch of a conductive object (e.g., a stylus, a user's finger, and the like) on a stack-up including a touch sensor and/or to a hover in which the conductive object is sufficiently proximate to affect the sensor elements of the touch sensor without being in physical touch with the touch-surface of the sensor. As used herein, "sensor element" (also referred to as "unit cell") refers to a discrete unit or location area (e.g., adjacency) of electrodes from which a measurement or signal can be obtained that is separate and distinct from measurements/signals obtained from other units or location areas in the touch sensor.

In single-layer touch sensors that use interleaved (also referred to as "interlaced") electrodes without "jumpers", a conductive object may affect portions (also referred to as "segments") from multiple electrodes, thereby causing a change in the capacitance even of electrodes that are not directly under the contact by the conductive object and that should not register or otherwise detect the contact. Such parasitic signal coupling outside of the actual touch-sensing area affected by the contact causes a parasitic signal increase or a parasitic signal decrease (e.g., depending on the type of sensing mechanism used by the touch sensor). Such parasitic signal increase or decrease in one or more sensor elements of a touch sensor is referred to herein as a "tail effect" and a "tail effect signal".

In one example embodiment, a device comprises a sensor array. The sensor array comprises first plurality of electrodes and second plurality of electrodes that are interleaved without intersecting each other within a touch-sensing area in a single layer on a substrate of the sensor array. A first electrode (of the first or second plurality) comprises at least two shaped portions that are positioned in association with a given second electrode. For example, the two shaped portions of the first electrode may be positioned across the given second electrode from each other. In another example, the second electrode may comprise two or more portions, and the shaped portion(s) of the first electrode may be positioned between the portions of the second electrode. The two shaped portions of the first electrode are routed in different directions on the substrate and are coupled to each other outside of the touch-sensing area of the sensor array.

In another example embodiment a sensor array comprises a substrate, first plurality of electrodes, and second plurality of electrodes. The first plurality of electrodes (e.g., such as receive, or RX, electrodes) and the second plurality of electrodes (e.g., such as transmit, or TX, electrodes) are interleaved/interlaced without intersecting each other within a touch-sensing area in a single layer on the substrate. A first shaped portion of a first electrode, of the first plurality of electrodes, is connected to a first primary trace of the first electrode and a second shaped portion of the first electrode is connected to a second primary trace of the first electrode. The first shaped portion and the second shaped portion of the first electrode are positioned in association with a second electrode of the second plurality of electrodes. For example, the first shaped portion of the first electrode may be positioned across at least a portion of the second electrode from the second shaped portion of the first electrode. In another example, the second electrode may comprise two or more portions, and the shaped portion(s) of the first electrode may be disposed between the portions of the second electrode. The first primary trace of the first electrode extends in a first direction on the substrate and the second primary trace of the first electrode extends in a second direction on the substrate, where the first primary trace is coupled to the second primary trace outside of the touch-sensing area. In some aspects of this embodiment, the first plurality of electrodes is disposed in multiple rows on the substrate and the second plurality of electrodes is disposed in multiple columns on the substrate, and the first plurality of electrodes is disposed on the substrate in one of an X-pattern, an I-pattern, and an H-pattern.

In another example embodiment, a device comprises a sensor array. The sensor array comprises RX electrodes and TX electrodes, where the RX electrodes and the TX electrodes are interleaved without intersecting each other within a touch-sensing area in a single layer on a substrate of the sensor array. A first shaped portion of an RX electrode is connected to a first primary trace of the RX electrode and a second shaped portion of the RX electrode is connected to a second primary trace of the RX electrode. The first and second shaped portions of the RX electrode are positioned in association with a TX electrode. For example, the first shaped portion of the RX electrode may be positioned across at least a portion of the TX electrode from the second shaped portion of the RX electrode. In another example, the TX electrode may comprise two or more portions, and the shaped portion(s) of the RX electrode may be disposed between the portions of the TX electrode. The first primary trace of the RX electrode extends in a first direction on the substrate and the second primary trace of the RX electrode extends in a second direction on the substrate, where the first primary trace of the RX electrode is coupled to the second primary trace of the RX electrode outside of the touch-sensing area of the sensor array. In some aspects of this embodiment, a sensor element is formed by the first shaped portion of the RX electrode, the second shaped portion of the RX electrode, and a portion of the TX electrode that is positioned between the first and second shaped portions of the RX electrode. The sensor element represents an area of the sensor array from which a distinct measurement, that represents a mutual capacitance between the RX electrode and the TX electrode, can be measured. In some aspects, the device further comprises a processing logic configured to perform a common mode filter operation. The common mode filter operation corrects both a common mode noise and a tail effect caused by contact from a conductive object, where the contact affects the first shaped portion of the RX electrode but does not affect one or more shaped portions of one or more RX electrodes, along the TX electrode, that are different from the RX electrode.

In another example embodiment, a system comprises a capacitive sensor array coupled to a capacitance sensor. The capacitive sensor array comprises RX electrodes and TX electrodes, where the RX electrodes and the TX electrodes are interleaved without intersecting each other within a touch-sensing area in a single layer on a substrate of the capacitive sensor array. A first shaped portion of a RX electrode is connected to a first primary trace of the RX electrode and a second shaped portion of the RX electrode is connected to a second primary trace of the RX electrode, where the first and second shaped portions of the RX electrode are positioned in association with a TX electrode. For example, the first shaped portion of the RX electrode may be positioned across at least a portion the TX electrode from the second shaped portion of the RX electrode. In another example, the TX electrode may comprise two or more portions, and the shaped portion(s) of the RX electrode may be disposed between the portions of the TX electrode. The first primary trace of the RX electrode extends in a first direction on the substrate and the second primary trace of the RX electrode extends in a second direction on the substrate, where the first primary trace is coupled to the second primary trace outside of the touch-sensing area of the sensor array. The capacitance sensor is configured to measure a plurality of measurements from the RX electrodes, the plurality of measurements being representative of a conductive object that is in contact with the capacitive sensor array. In some aspects of this embodiment, the system further comprises a display disposed under the capacitive sensor array, and the capacitance sensor is configured to perform a common mode filter operation that corrects both a tail effect signal caused by the contact and a noise signal caused by the display.

Example Operational Contexts

FIG. 1 illustrates a block diagram of one example embodiment of an electronic system 100 including a processing device 110 that may be configured to measure signals representing capacitances from a touch sensor array that is designed to have minimum tail effects. The electronic system 100 includes a touch-sensing surface 116 (e.g., a touchscreen, a touch pad, or the like) coupled to the processing device 110 and a host 150. In some embodiments, the touch-sensing surface 116 is a user interface that uses a touch sensor array 121 to detect touches on the surface 116.

In the example embodiment of FIG. 1, the touch sensor 121 includes sensor electrodes 121(1)-121(N) (where N is a positive integer) that are interleaved without intersecting each other (e.g., in a SLIM pattern) on a single layer of a substrate. The touch sensor 121 is coupled to pins 113(1)-113(N) of the processing device 110 via one or more analog buses 115 transporting multiple signals. For illustration purposes, in this embodiment each electrode 121(1)-121(N) is represented as a capacitor. The self-capacitance of each electrode in touch sensor 121 is measured by a capacitance sensor 101 in the processing device 110. Depending on the type of touch sensor, in some embodiments the capacitance sensor may be configured to detect the mutual capacitance of an electrode when a conductive object (e.g., stylus, user's finger, etc.) is in contact with one or more electrodes.

Capacitance sensor 101 (also referred to as just "sensor") may include a relaxation oscillator or other means to convert a capacitance into a measured value. Capacitance sensor 101 may also include a counter or timer to measure the oscillator output. The capacitance sensor 101 may further include software components to convert the count value (e.g., capacitance value) into a detection decision (also referred to as switch detection decision) or relative magnitude. In some embodiments, the measured value obtained by capacitance sensor 101 may be a signal value that represents one or more characteristics of a signal; in addition, or instead of, in some embodiments a signal value may be a value that is derived from the measured value based on a signal characteristic, e.g., such as voltage and/or current magnitude, raw capacitance, and the like. It should be noted that there are various known methods for measuring capacitance, such as current versus voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms. It should also be noted that instead of evaluating the raw counts relative to a threshold, a capacitance sensor may be evaluating other measurements to determine the user interaction. For example, in a capacitance sensor having a sigma-delta modulator, the capacitance sensor may be evaluating the ratio of pulse widths of the output, instead of the raw counts being over or under a certain threshold.

In the example embodiment of FIG. 1, processing device 110 further includes processing logic 102. Operations of processing logic 102 may be implemented in firmware; alternatively, they may be implemented in hardware or software. Processing logic 102 is configured to perform operations that correct (simultaneously and/or concurrently) both tail effects and common mode noise as described herein. For example, processing logic 102 may receive measurements from capacitance sensor 101, adjust the measurements to compensate/eliminate tail effects and common mode noise signals, and then use the adjusted measurements to determine the state of touch sensor 121, such as whether an object (e.g., a finger, a stylus, or the like) is detected on or in proximity to the touch sensor (e.g., determining the presence of the object), where the object is detected on the touch sensor (e.g., determining the location of the object), tracking the motion of the object, or other information related to an object detected at the touch sensor.

In another embodiment, instead of performing the operations of the processing logic in a processing device (e.g., such as processing device 110), the processing device may send the raw data or partially-processed data to a host, e.g., such as host 150. As illustrated in FIG. 1, host 150 may include decision logic 151 that performs some or all of the operations described above for processing logic 102. Operations of decision logic 151 may be implemented in firmware, hardware, software, or a combination thereof. Host 150 may include a high-level Application Programming Interface (API) in applications 152 that perform routines on the received data, such as compensating for sensitivity differences, other compensation algorithms, baseline update routines, start-up and/or initialization routines, interpolation operations, scaling operations and/or operations that correct both tail effects and common mode noise as described herein. The operations described with respect to the processing logic 102 may be implemented in the decision logic 151, the applications 152, or in other hardware, software, and/or firmware external to the processing device 110. In some other embodiments, the processing device 110 may be the host 150.

In another embodiment, processing device 110 may also include a non-sensing actions block 103. This block 103 may be used to process and/or receive/transmit data to and from the host 150. For example, additional components may be implemented to operate with the processing device 110 along with touch sensor 121 (e.g., keyboard, keypad, mouse, trackball, LEDs, displays, or other peripheral devices).

Processing device 110 may reside on a common carrier substrate such as, for example, an integrated circuit (IC) die substrate, or a multi-chip module substrate. Alternatively, the components of the processing device 110 may be one or more separate integrated circuits and/or discrete components. In one embodiment, processing device 110 may be a programmable system on a chip that is manufactured on a single IC die such as, for example, the Programmable System on a Chip (PSoC™) processing device, developed by Cypress Semiconductor Corporation, San Jose, Calif. Alternatively, processing device 110 may be one or more other processing devices known by those of ordinary skill in the art, such as a microprocessor or central processing unit, a controller, a special-purpose processor, a digital signal processor (DSP), an application specific integrated circuit (ASIC), a field programmable gate array (FPGA), or other programmable device. In an alternative embodiment, for example, processing device 110 may be a network processor having multiple processors including a core unit and multiple micro-engines. Additionally, processing device 110 may include any combination of general-purpose processing device(s) and special-purpose processing device(s).

In one embodiment, electronic system 100 is implemented in a device that includes touch-sensing surface 116 as the user interface, such as handheld electronics, portable and/or smart telephones, cellular telephones, notebook computers, personal computers, personal data assistants (PDAs), kiosks, keyboards, televisions, remote controls, monitors, handheld multimedia devices, handheld video players, gaming devices, control panels of a household or industrial appliances, or other computer peripheral or input devices. Alternatively, electronic system 100 may be used in other types of devices. It should be noted that the components of electronic system 100 may include all the components described above. Alternatively, electronic system 100 may include only some of the components described above, or include additional components not listed herein.

Figure 2:
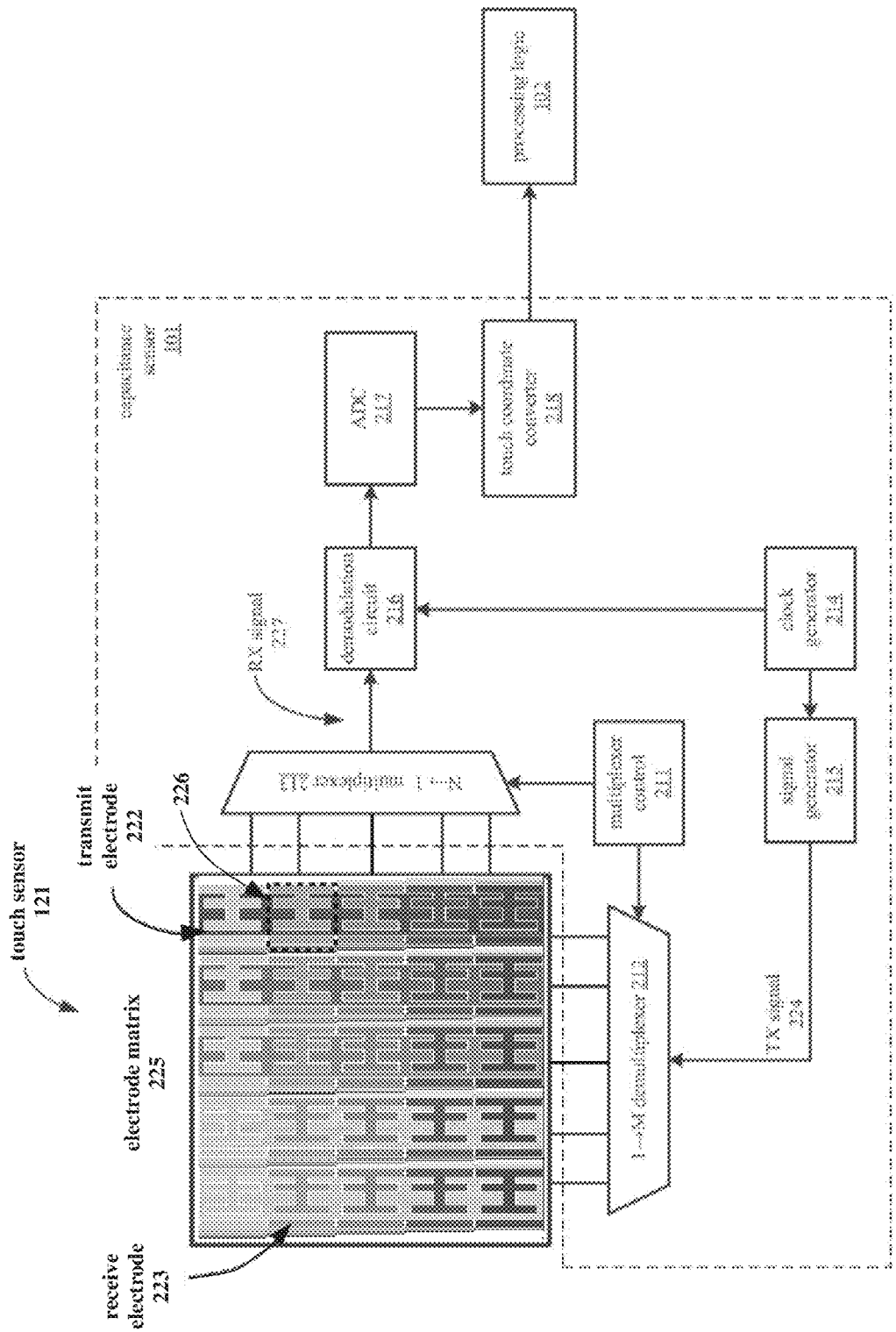
FIG. 2 is a block diagram illustrating an embodiment of an example sensor system that processes touch sensor data.

FIG. 2 is a block diagram illustrating one embodiment of a capacitive touch sensor 121 and a capacitance sensor 101 (also referred to as just "sensor") that converts measured signal values representing capacitances to coordinates. The coordinates are calculated based on the measured capacitance-representing values. In one embodiment, touch sensor 121 and capacitance sensor 101 are implemented in a system such as electronic system 100. Touch sensor 121 includes a matrix 225 having N receive electrodes and M transmit electrodes. For example, matrix 225 includes transmit (TX) electrode 222 and receive (RX) electrode 223. Each of the electrodes in matrix 225 is connected with the capacitance sensing circuitry of capacitance sensor 101 through demultiplexer 212 and multiplexer 213.

Capacitance sensor 101 includes multiplexer control 211, demultiplexer 212 and multiplexer 213, clock generator 214, signal generator 215, demodulation circuit 216, and analog to digital converter (ADC) 217. ADC 217 is further coupled with touch coordinate converter 218. Touch coordinate converter 218 outputs a signal to processing logic 102.

The transmit and receive electrodes in matrix 225 may be arranged so that each of the transmit electrodes is interleaved with the receive electrodes on the same (e.g., a single) substrate layer, but without intersecting the receive electrodes and while maintaining electrical isolation from them. Thus, each transmit electrode may be capacitively coupled with each of the receive electrodes. For example, transmit electrode 222 is capacitively coupled with receive electrode 223 at sensor-element area 226 of matrix 225, where the "H"-shaped portion of receive electrode 223 is interleaved within a portion of transmit electrode 222. In the electrode pattern illustrated in matrix 225, the "H"-shaped portions (and their opposing shaped portions) at the same horizontal level are electrically coupled to each other in the bezel portion (not shown) of touch sensor 121 to form a single (horizontal) receive electrode, while each transmit electrode runs (vertically) from the top to the bottom of matrix 225.

In some embodiments, a capacitance sensor (e.g., such as sensor 101 in FIG. 1) may be configured to use mutual capacitance sensing technique according to which a value representing mutual capacitance present at the sensor-element area of two electrodes can be measured by a processing device (e.g., such as processing device 110 in FIG. 1). The change in this mutual capacitance at one or more sensor-element areas allows a processing logic to determine the location of a contact on the touch sensor. With mutual capacitance sensing, one set of electrodes (e.g., such as the column electrodes) are designated as transmit (TX) electrodes. The transmit electrodes are driven with a TX signal that is applied to the transmit electrodes by a transmit multiplexer. Another set of electrodes (e.g., such as the row electrodes) are designated as receive (RX) electrodes. Signal values representing the mutual capacitance of the sensor elements, formed at the areas where the rows and columns of electrodes are interleaved with each other, may be measured by sampling a signal on each of the receive electrodes. In some embodiments, a receive multiplexer may be used to sample the signal on one or more of the receive electrodes and to provide the receive measurement signal back to the processing logic 102 (and/or to another component of the processing device). In some embodiments, the roles of RX and TX electrodes may be reversed for some particular scan operation(s). For example, in some scan operations, the RX electrodes may be driven with a scan signal and the TX electrodes may be configured to measure signals that represent the mutual capacitance formed between the RX and TX electrodes.

Referring back to FIG. 2, clock generator 214 supplies a clock signal to signal generator 215, which produces a transmit (TX) signal 224 to be supplied to the transmit electrodes of touch sensor 121. In one embodiment, signal generator 215 includes a set of switches that operate according to the clock signal from clock generator 214. The switches may generate a TX signal 224 by periodically connecting the output of signal generator 215 to a first voltage and then to a second voltage, where said first and second voltages are different.

The output of signal generator 215 is connected with demultiplexer 212, which allows a TX signal 224 to be applied to any of the M transmit electrodes of touch sensor 121. In one embodiment, multiplexer control 211 controls demultiplexer 212 so that the TX signal 224 is applied to each transmit electrode 222 in a controlled sequence. Demultiplexer 212 may also be used to ground, float, or connect an alternate signal to the other transmit electrodes to which the TX signal 224 is not currently being applied.

Because of the capacitive coupling between the transmit electrodes and the receive electrodes, a TX signal 224 applied to each transmit electrode induces a current within each of the receive electrodes. For instance, when the TX signal 224 is applied to transmit electrode 222 through demultiplexer 212, the TX signal 224 induces a receive (RX) signal 227 on the receive electrodes in matrix 225. The RX signal 227 on each of the receive electrodes can then be measured in sequence by using multiplexer 213 to connect each of the N receive electrodes to demodulation circuit 216 in sequence.

Signal values representing the mutual capacitance associated with each sensor element (e.g., the area where a given TX electrode is interleaved with a given an RX electrode), can be sensed by selecting every available combination of TX electrode and RX electrode using demultiplexer 212 and multiplexer 213. To improve performance, multiplexer 213 may also be segmented to allow more than one of the receive electrodes in matrix 225 to be routed to additional demodulation circuits 216. In an optimized configuration, where there is a 1-to-1 correspondence of instances of demodulation circuit 216 with receive electrodes, multiplexer 213 may not be present in the system.

When a conductive object, such as a finger, approaches electrode matrix 225, the object causes a decrease in the mutual capacitance between only some of the electrodes. For example, if a finger is placed near sensor-element area 226 (where transmit electrode 222 is interleaved with receive electrode 223), the presence of the finger will decrease the mutual capacitance between electrodes 222 and 223. Thus, the location of the finger on touch sensor 121 can be determined by identifying the one or more receive electrodes having a decreased mutual capacitance and by identifying the transmit electrode to which the TX signal 224 was applied at the time the decreased mutual capacitance was measured on the one or more receive electrodes.

By determining the mutual capacitances associated with each sensor element formed by the transmit and receive electrodes in matrix 225, the locations of one or more touch contacts may be determined. The determination may be sequential, in parallel, or may occur more frequently at commonly used electrodes.

In some embodiments, other methods for detecting the presence of a finger or conductive object may be used where the finger or conductive object causes an increase in capacitance at one or more electrodes, which may be arranged in a particular interleaved pattern. For example, a finger placed near an electrode of a touch sensor may introduce an additional capacitance to ground that increases the total capacitance between the electrode and ground. The location of the finger can be determined from the locations of one or more electrodes at which an increased capacitance is detected.

The induced current signal 227 is rectified by demodulation circuit 216. The rectified current output by demodulation circuit 216 can then be filtered and converted to a digital code by ADC 217.

The digital code may then be converted to touch location coordinates indicating a position of an input on touch sensor 121 by touch coordinate converter 218. The touch location coordinates are transmitted as an input signal to processing logic 102. In one embodiment, the input signal is received at an input to processing logic 102. In one embodiment, the input may be configured to receive capacitance measurements indicating a plurality of row coordinates and a plurality of column coordinates. Alternatively, the input may be configured to receive row coordinates and column coordinates.

In some embodiments, processing logic 102 may be configured to generate (or to receive, e.g., from touch coordinate receiver 218) signal measurements that represent diff signals (also referred to herein as "diff signal values"). For example, processing logic 102 may be configured to determine a diff signal for a given sensor element as the difference between the settled/baseline (e.g., expected or fully charged) capacitance of a sensor element (e.g., when a conductive object is not in contact with the touch sensor and the touch sensor is not being scanned) and the capacitance of the sensor element that is measured as part of a scan operation (e.g., when a conductive object may or may not be in contact with the touch sensor). The capacitance used to compute a diff signal for a sensor element may be a self-capacitance and/or a mutual capacitance of the sensor element.

In various embodiments, the processing logic may compute the diff signals for each of the sensor elements in a touch sensor based on signal measurements that represent the self-capacitances and/or the mutual capacitances of the sensor elements. For example, a self-capacitance of a given sensor element may include a capacitance formed between the sensor element and a reference voltage (e.g., such as ground). A mutual capacitance of a given sensor element may include a capacitance formed between the transmit and receive electrodes that form the sensor element and/or one or more conductive objects (e.g., such as a stylus or user's finger) that are electrically insulated from the capacitive sensor element.

Single-Layer Touch Sensors

Attempts have been made in the past to reduce the number of layers, and thus the manufacturing costs, of touch sensors. In some embodiments, single-layer touch sensors are suited only for single touch reception. These touch sensors typically use a series of electrodes the widths of which linearly change from one end to the other end of an electrode. Using the signal variation along the electrode's length, the coordinate of a touch along the electrode's axis is determined. The coordinate of the touch in the perpendicular direction to the electrode's axis is determined by a conventional digitization method. In other embodiments, a single-layer multiple-touch sensor uses an array of pads filling the sensor area, and each of the pads (or electrodes) are sensed individually in a self-capacitance sensing mode. Such embodiments usually require independent traces for each of the sensing pads and a very large number of measuring channels and pins on the controller chip to get an acceptable accuracy for even a small size sensor.

According to the techniques described herein, in some embodiments a touch-sensing device includes a touch sensor that has a single-layer active area. Additionally, the touch-sensing device is provided with a wiring scheme that minimizes the number of wires, as well as the traces, required to simultaneously detect multiple contacts (e.g., such as "touches"). As a result, the overall manufacturing costs of the touch sensor, and correspondingly of the touch sensor device, can be reduced.

FIGS. 3A and 3B are simplified views of a device 301 (e.g., such as a capacitive touch-sensing device) according to an example embodiment. In this embodiment, device 301 is a "touchscreen" device that includes a touch sensor having an active area 302 and a non-active area 303. As used herein, "central area" (also referred to as "active area" and "touch-sensing area") of a touch sensor refer to an area of the sensor that can generate a signal, cause a capacitance change, or otherwise detect one or more contacts. "Outer area" (also referred to as "non-active area" and "non-sensing area") of a touch sensor refer to an area that does not detect or otherwise respond to contacts. Device 301 includes a liquid crystal display (LCD) panel 304 arranged below a touch sensor 305 (e.g., such as a sensor array or assembly). As is commonly understood, the active area 302 may correspond to the size and shape of a transparent (e.g., visible) region of the touch sensor 305, while the non-active area 303 may correspond to a non-transparent (e.g., non-visible) region of the touch sensor 305 which may be covered by a casing (not shown) or other means that prevent the effect of contacts. Touch sensor 305 is disposed in a stack-up that includes an overlay (or protective layer) 306 attached to a side thereof opposite the LCD panel by an optically clear adhesive (OCA) 307. Device 301 may also include a flexible printed circuit (FPC) tail 308 extending therefrom, which may be used to route electrical signals to and from touch sensor 305.

Figure 3C:
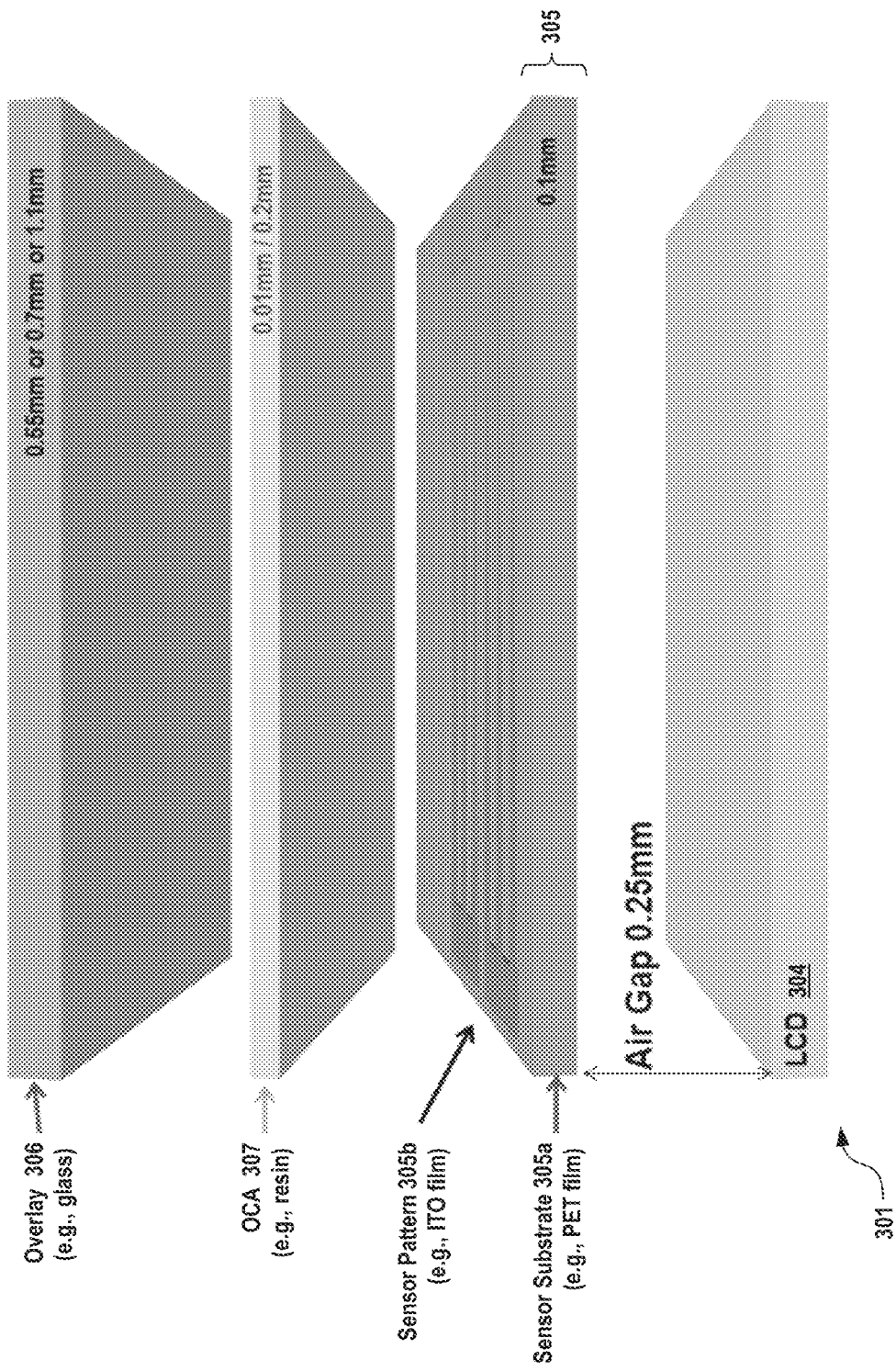
FIG. 3C illustrates an isometric view of an example stack-up in a touch-sensing device according to some embodiments.

FIG. 3C is an isometric view of an example stack-up of device 301 according to an example embodiment. This embodiment uses a glass-film (GF) stack-up disposed over LCD panel 304. The stack-up includes a glass overlay (or lens) 306 that is attached by means of OCA layer 307 to a touch sensor 305 having a sensor film layer. Touch sensor 305 may include a sensor substrate 305a (e.g., made of polyethylene terephthalate, or PET, film) and a sensor pattern 305b (e.g., made of indium-tin oxide, or ITO, film). In the embodiment illustrated in FIG. 3C, the thickness of overlay 306 may be in the range of 0.55 mm to 1.1 mm, the thickness of OCA layer 307 may be in the range of 0.01 mm to 0.2 mm, and the thickness of sensor substrate 305a may be substantially about 0.1 mm. Touch sensor 305 and LCD panel 304 are separated by an air gap of substantially about 0.25 mm. It is noted that while the embodiment illustrated in FIG. 3C provides for a very cheap stack-up that offers a very thin touch-sensing solution, various embodiments may use stack-ups having various thickness with various number of layers in various combinations.

For example, in some embodiments the touch sensor may be laminated by roll-to-roll, and the overlay may be made not only from glass but also from plastic—e.g., such as Polymethyl Methacrylate (PMMA), or Acrylic, glass. Some embodiments may use on-cell stack-ups, in which the touch sensor stack-up is integrated with the display panel—e.g., by being placed between the color filter glass and the polarizer of the display panel. In some embodiments, a touch sensor stack-up may be built on the underside of an overlay glass cover, which acts as the sensor substrate. Various embodiments may also use stack-up layers in various combinations such as, for example, a glass overlay and one sensor film layer (GF1 stack-up), PMMA overlay and one sensor film layer (PF1 stack-up), glass overlay and one sensor film layer with connecting bridges (G2 stack-up), glass overlay with one non-film sensor layer (G1M), glass overlay and two sensor film layers (GFF), and glass overlay and one sensor layer on glass substrate (GG stack-up). Further, various embodiments may use various number of layers in the touch sensor stack-up, which may result with stack-ups having thickness in the ranges of 0.5 mm to 1.0 mm, 0.6 mm to 1.2 mm, 0.8 mm to 1.5 mm, 1.0 mm to 1.8 mm, and more generally in any sub-range in the range from 0.5 mm to 1.8 mm. Thus, the touch sensor stack-up illustrated in FIG. 3C is to be regarded in an illustrative rather than a restrictive sense.

Figure 3D:
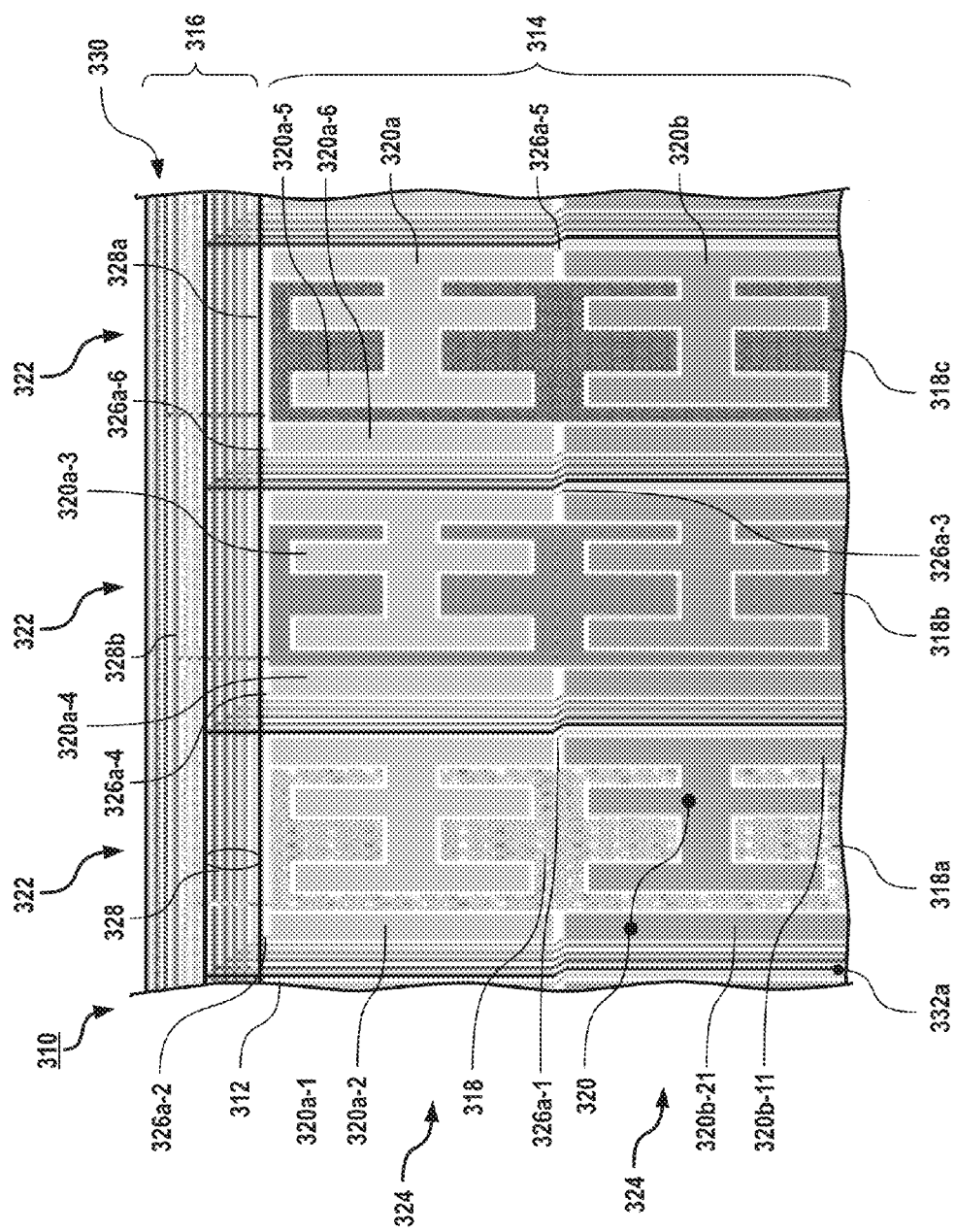
FIG. 3D illustrates a portion of a touch sensor according to an example embodiment.

FIG. 3D illustrates a portion of a single-layer touch sensor 310 (e.g., such as a capacitive sensor array) according to an example embodiment of the techniques for single-layer touch sensor designs described herein. Touch sensor 310 includes a substrate 312 having an active area (or central portion) 314 and a non-active area (or bezel portion) 316 near the edge(s) of substrate 312. Central portion 314 of substrate 312 may correspond to the active (e.g., touch-sensing) area of a touch-sensing device (e.g., such as area 302 of device 301 in FIG. 3A). Bezel portion 316 of substrate 312 may correspond to the non-active (e.g., non-sensing) area of the touch-sensing device (e.g., such as area 303 of device 301 in FIG. 3A). In some embodiments, substrate 312 is made of an electrically insulating material with high optical transmissivity, such as glass, polyethylene terephthalate (PET), or a combination thereof.

An array of electrodes is formed on central portion 314 of substrate 312, which includes a first set (or plurality) of electrodes 320 (also referred to as "first electrodes") and a second set (or plurality) of electrodes 318 (also referred to as "second electrodes"). First electrodes 320 and second electrodes 318 are all formed on the same (e.g., a single) layer of substrate 312, but without intersecting each other and while maintaining electrical isolation from each other. In some embodiments, in order to form the first and second electrodes, a layer of transparent conductive material, such as indium-tin oxide (ITO) or a silver nano-particle film, may be deposited on (or over) substrate 312. As will be described in more detail hereinafter, first electrodes 320 may be used as receive (RX) electrodes, and second electrodes 318 may be used as transmit (TX) electrodes during scan operations that are performed on touch sensor 310. It should be understood, however, that these TX and RX roles are merely exemplary and may be reversed in various other embodiments. For example, in some scan operations, the RX electrodes may be driven with a scan signal and the TX electrodes may be configured to measure signals that represent the mutual capacitance formed between the RX and TX electrodes.

According to the techniques for designs of single-layer touch sensors described herein, a first electrode comprises at least two shaped portions, at least two primary traces, and one or more secondary traces, where the primary traces and the shaped portion of the first electrode are disposed in the active (touch-sensing) area of the touch sensor. As used herein, a primary trace is also referred to as a "line" or a "trace line". A "shaped" portion of an electrode has width that is greater than the width of a primary trace and a geometric shape that is different from a substantially straight line. A shaped portion is electrically connected to a respective primary trace that runs in a respective direction, and each primary trace is electrically coupled to a secondary trace in a non-active (non-sensing) area of the touch sensor corresponding to the respective direction. A given first electrode includes a first shaped portion and a second shaped portion, where the first shaped portion and the second shaped portion are disposed in association with (at least a portion of) a given second electrode. (The second shaped portion of a first electrode is also referred to as "opposing shaped portion" and "opposing portion" hereinafter.) For example, the first shaped portion of the given first electrode may be disposed across at least a portion of the given second electrode from the second shaped portion of the first electrode. In another example, the given second electrode may comprise two or more portions, and the shaped portion(s) of the first electrode may be disposed between the portions of the second electrode. The first shaped portion of a given first electrode is electrically connected to a first primary trace that runs in a first direction, and the second/opposing shaped portion is electrically connected to a second primary trace that runs in a different (e.g., opposing) direction than the first direction. The first primary trace and the second primary trace of a given electrode are coupled to each other outside of the touch-sensing area (e.g., in the non-sensing, bezel area) of the touch sensor—e.g., via first and second corresponding secondary traces. A given primary trace of a given first electrode is routed in the active area of the touch sensor in a given direction along at least a portion of one or more other primary traces of one or more other first electrodes that are disposed in the active area of the touch sensor. Further, a given primary trace of a given first electrode is routed in the active area along at least a portion of a given second electrode. A given secondary trace, which electrically couples a given primary trace of a given first electrode, is routed in the non-active area (e.g., such as a bezel portion) of the touch sensor. Thus, a given primary trace of a given first electrode can be affected by a contact from a conductive object (which can contribute to changes in the signals measured from the given first electrode during a scan operation) because the given primary trace is routed in the active, touch-sensing area of the touch sensor. On the other hand, a given secondary trace is typically not affected by such contact because the secondary trace is routed in the non-active, non-sensing area of the touch sensor and therefore does not have an effect on the signals measured from the first electrode during the scan operation.

Referring to FIG. 3D, second electrodes 318 are disposed substantially vertically and may extend from a top non-active area (or bezel) portion 316 to a bottom bezel portion (not shown). In the portion of touch sensor 310 depicted in FIG. 3D, three second electrodes 318 (e.g., 318a, 318b, and 318c) and two first electrodes 320 (e.g., 320a and 320b) are included. The three second electrodes are arranged substantially vertically and may extend along substantially the entire length of central portion 314 of substrate 312. It should be understood, though, that other embodiments may use different numbers of second electrodes that may extend in directions other than vertical.

As an illustration, in FIG. 3D first electrodes 320 are arranged in rows 324 and second electrodes 318 are arranged in columns 322, where each of the rows 324 includes one of the first electrodes 320 and each of the columns 322 includes one of the second electrodes 318. Each of first electrodes 320 includes a substantially "H"-shaped portion and an opposing (e.g., substantially "I"-shaped) portion, where the two shaped portions are disposed across one of second electrodes 318 from each other. Each of the "H"-shaped portions of a given first electrode 320 is interleaved with a respective one of the second electrodes 318 (e.g., in an interdigitated pattern). Within each row 324, the "H"-shaped portions and the opposing shaped portions of a given first electrode 320 are electrically coupled to each other by means of corresponding primary and secondary traces, where the primary traces for each row 324 are coupled to corresponding secondary traces and the secondary traces for each row 324 are coupled to each other in a non-sensing area of touch sensor 310.

For example, first electrode 320a includes three "H"-shaped portions (e.g., 320a-1, 320a-3, 320a-5) each of which is electrically connected to a respective primary trace (e.g., 326a-1, 326a-3, 326a-5, correspondingly) that extends in a downward direction to the bottom non-sensing area of touch sensor 310. First electrode 320a also includes three opposing shaped portions (e.g., 320a-2, 320a-4, 320a-6) each of which is electrically connected to a respective primary trace (e.g., 326a-2, 326a-4, 326a-6, correspondingly) that extends in an upward direction to the top bezel portion 316. The primary traces (e.g., 326a-1, 326a-3, 326a-5) of the "H"-shaped portions are electrically connected to a secondary trace that is located in the bottom non-sensing area of touch sensor 310, and the primary traces (e.g., 326a-2, 326a-4, 326a-6) of the opposing shaped portions are electrically connected to a corresponding secondary trace 328a in the top bezel portion 316. Secondary trace 328a and the secondary trace for the "H"-shaped portions of first electrode 320a are coupled to each other somewhere (not shown in FIG. 3D) in the non-sensing area of touch sensor 310. As illustrated in FIG. 3D, first electrode 320b includes similarly arranged "H"-shaped and opposing shaped portions, primary traces, and secondary traces. It is noted that the specific electrode patterns shown in FIG. 3D are merely exemplary and thus other electrode shapes and interleave patterns, which may not necessarily be interdigitated, are possible and within the scope of the techniques described herein.

The first electrodes 320, the second electrodes 318, and the primary traces 326 may be made of indium tin oxide (ITO) and may be formed in a substantially planar manner on the same (e.g., a single) substrate layer. That is, although not specifically shown in FIG. 3D, the first electrodes 320, the second electrodes 318, and the primary traces 326 may have substantially the same thickness and may lay in substantially the same plane.

As illustrated in FIG. 3D, an insulating material (or body or layer) 330 is formed or otherwise attached to the bezel portion 316 of substrate 312. The insulating material 330 covers the end portions of the primary traces 326 that extend onto the bezel portion 316, but it should be noted that the insulating material 330 does not extend over the central portion 314 of substrate 312. The insulating material 330 may be made of, for example, an epoxy or resin material and have a thickness of, for example, between 5 and 25 micrometers (μm) that is deposited on substrate 312. In some embodiments, the insulating material 330 may be a flexible substrate, such as a flexible printed circuit (FPC), attached to substrate 312. The insulating material 330 electrically separates a given secondary trace 328 from at least some of the primary traces 326. For example, in FIG. 3D, the insulating material 330 insulates the secondary trace 328a from the primary traces that are connected to first electrode 320b and from the primary traces of those other first electrodes 320 that are different from electrode 320a.

The secondary traces (or plurality of conductors) 328 are formed on the insulating material 330 in the bezel portion 316 of substrate 312. In one embodiment, the secondary traces 328 are made of silver. Of interest in the embodiment of FIG. 3D is that a given secondary trace 328 (e.g., such as 328a) is electrically connected to the primary traces 326 (e.g., such as 326a-2, 326a-4, 326a-6) that are associated with a given first electrode 320 (e.g., such as 320a) in a given one (and only one) of rows 324. Further, in the embodiment of FIG. 3D, a separate secondary trace is electrically coupled to a corresponding one of second electrodes 318. For example, secondary trace 328b is coupled to second electrode 318b. To reduce the routing area in the bezel portion 316, in some embodiments the trace width and spacing of the secondary traces 328 in the bezel area may be minimized. For example, a metal trace line width of 10-50 μm and a spacing of 10-50 μm may be used in the bezel area. Further, in some embodiments the secondary traces may be disposed in multiple layers in the bezel area (e.g., with each such layer being electrically isolated from the others) and/or on the opposite side of the substrate from the first and second electrodes.

In various embodiments, a touch sensor may include an additional set of ground traces. In FIG. 3D, an additional set of ground traces is formed in the active area of touch sensor 310 and is routed substantially in parallel to the second electrodes 318. An example of such additional traces is ground trace 332a, which extends substantially in parallel adjacent to second electrode 318a. A ground trace may be used to provide a ground in order to electrically isolate a given second electrode 318 from the immediately neighboring/adjacent primary traces 326 that are connected to the shaped portions of first electrodes 320. As such, each of the ground traces may be electrically connected to at least one of the secondary traces 328 that is coupled to the system ground. Further, in some embodiments the shaped portions of the first electrodes may have substantially the same shape and/or width in order to provide a shield from the primary traces and/or shaped portions of other RX electrodes. For example, as illustrated in FIG. 3D, first shaped portion 320b-11 of electrode 320b has substantially the same shape/width of second shaped portion 320b-21 of electrode 320b, and the shaped portions 320b-11 and 320b-21 are arranged across electrode 318a in a way that provides shielding for electrode 320b.

In operation, the secondary traces 328 are coupled to (e.g., are in operable communication with) an electronic system (e.g., such as the system illustrated in FIG. 2) in order to perform scan operations on touch sensor 310. In a scan operation, touch sensor 310 is operated by providing a signal to each one (referred to as "the driven" TX electrode) of the second electrodes 318 in turn, while grounding the remaining second electrodes 318. Signals are induced in those first electrodes 320 (RX electrodes) that have shaped portions interleaved with the driven TX electrode because of the capacitive coupling therebetween. The signals induced in the RX electrodes are measured and/or recorded by a processing logic in the electronic system. The measured/recorded signals may change (from pre-determined baseline value(s)) due to the presence of a conductive object (e.g., such a finger or stylus) that is in contact with a portion of touch sensor 310. A signal change (e.g., from a baseline value) measured on the RX electrodes is indicative of change in the capacitance (e.g., in the "mutual capacitance") between one or more of the RX electrodes and the driven TX electrode. After measuring the signals on the RX electrodes, the scan operation continues by providing a signal to the next TX electrode and measuring the corresponding RX electrodes in the same manner.

Tail Effect

The tail effect in a single-layer touch sensor may be a parasitic signal increase or a parasitic signal decrease in one or more sensor elements in response to a contact by a conductive object (e.g., a stylus, a user's finger, etc.) with the touch sensor. In some embodiments, the tail effect for a given sensor element is caused by a parasitic signal coupling between a TX electrode and a primary trace of that element's RX electrode whose corresponding shaped portions are outside the actual contact area and are thus not affected by the contact.

A single-layer touch sensor with conventional design typically uses one-directional routing, in which a primary trace for an electrode (e.g., such as an RX electrode) extends in one particular direction towards a non-sensing area of the touch sensor. Such one-directional routing leads to one-directional tail effect, as illustrated in FIGS. 4A and 4B.

Figure 4A:
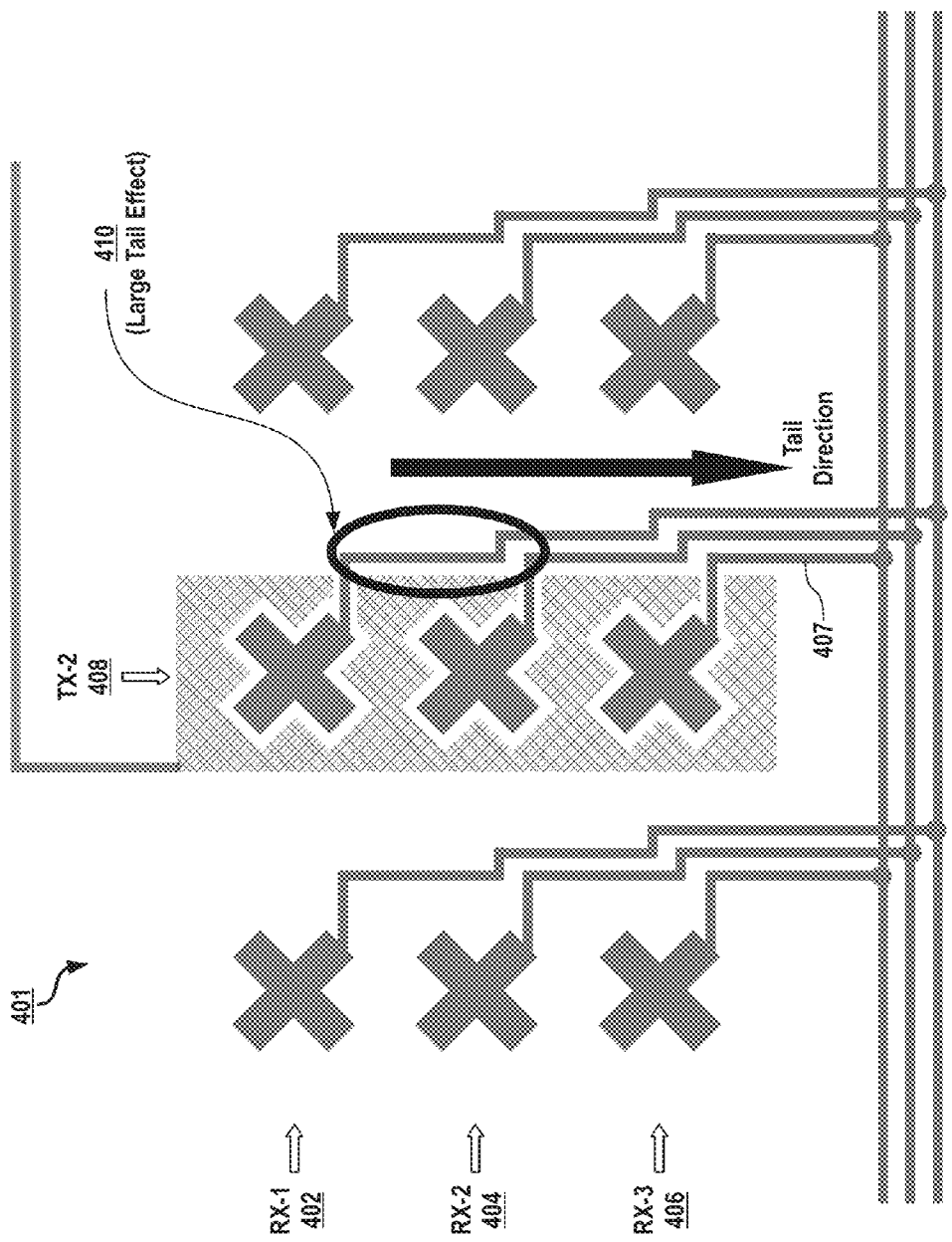
FIG. 4A illustrates an example schematic of a touch sensor with a SLIM-X electrode pattern that illustrates tail effect.

FIG. 4A illustrates an example schematic of a touch sensor with a SLIM-X electrode pattern. In FIG. 4A, a portion of a single-layer touch sensor 401 is shown to include RX electrodes 402 ("RX-1"), 404 ("RX-2"), and 406 ("RX-3"). Each of RX electrodes 402, 404, and 406 is interleaved with a set of TX electrodes, of which for illustration purposes only TX electrode 408 is depicted in FIG. 4A. In operation, when a conductive object is in contact with the touch-sensing area of touch sensor 401 (e.g., around area 410), the one-directional routing (e.g., 407) of RX electrodes 402, 404, and 406 towards the bottom of the touch sensor leads to asymmetrical object profile with a large tail effect extending towards the bottom of the touch sensor. This tail effect is caused at least in part because the routing of an RX electrode (e.g., RX electrode 402) is in close proximity with the sensor element formed by TX electrode 408 and RX electrode 404 (which is directly affected by the contact from the conductive object). The asymmetrical profile caused by the tail effect results in significant accuracy errors. For example, an accuracy test error of more than 1 mm (>1 mm) may be obtained for single-layer touch sensors with typical sensor pitch dimensions of approximately ~5 mm, while double-layer touch sensors (e.g., having Double-Solid Diamond—DSD designs, Single Solid Diamond—SSD designs, Totem Pole—TP designs, and Manhattan—MH designs) comparable in size would have an accuracy test error of less than 0.5 mm (<0.5 mm).

Figure 4B:
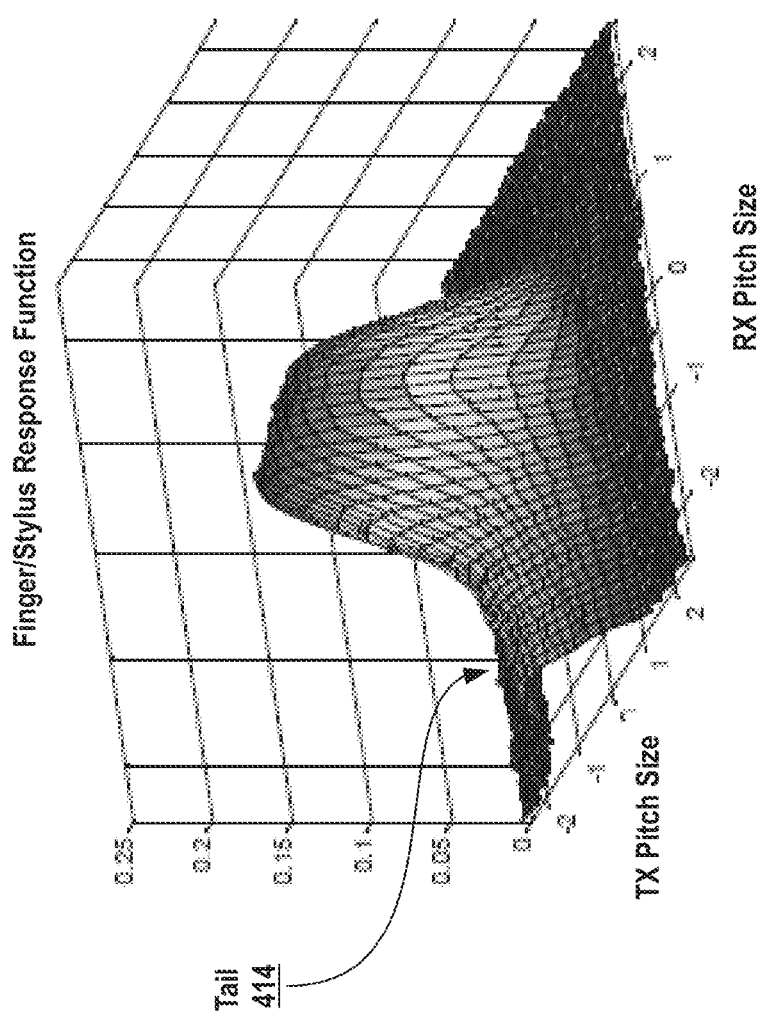
FIG. 4B illustrates a three-dimensional plot of example response functions for the sensor elements of a touch sensor, e.g., such as the touch sensor illustrated in FIG. 4A.

FIG. 4B illustrates a three-dimensional plot of example response functions for the sensor elements of a touch sensor, e.g., such as the touch sensor illustrated in FIG. 4A. In FIG. 4B, a response function is a function of the position of a conductive object (e.g., such as a finger or a stylus) that represents the reaction of one sensor element. The response functions for all sensor elements may be viewed as the sensitivity map of a contact, and such map may depend on various parameters such as the capacitance change on the position of the contact, the response profile of the contact on the x-y position of the conductive object, the capacitive response of the conductive object, as well as the type of the touch sensor, the width of the sensor electrodes, the size of the conductive object, and thickness of the glass overlay. As illustrated in FIG. 4B, a conductive object in contact with the touch sensor has produced a visible tail 414.

One way to improve the accuracy of single-layer touch sensors is to use various compensation algorithms (e.g., as executed in firmware or performed by other processing logic) to compensate for, and correct, the tail effect based on signal values that are derived from measurements obtained from the touch sensor. The techniques described herein, however, provide for a different and/or additional mechanism that relies on the design of the single-layer touch sensors to minimize inaccuracies that are caused by tail effect.

Examples of Designs with Minimum Tail Effect

According to the techniques described herein, single-layer touch sensor designs are provided in which the same first electrode (e.g., RX electrode) of a touch sensor is routed in two different (e.g., opposing) directions along a given second electrode (e.g., TX electrode) of the touch sensor. Such multi-directional electrode routing makes the response functions of the sensor elements of the touch sensor more symmetrical, which in turn results in a smaller/minimum tail effect.

Figure 5A:
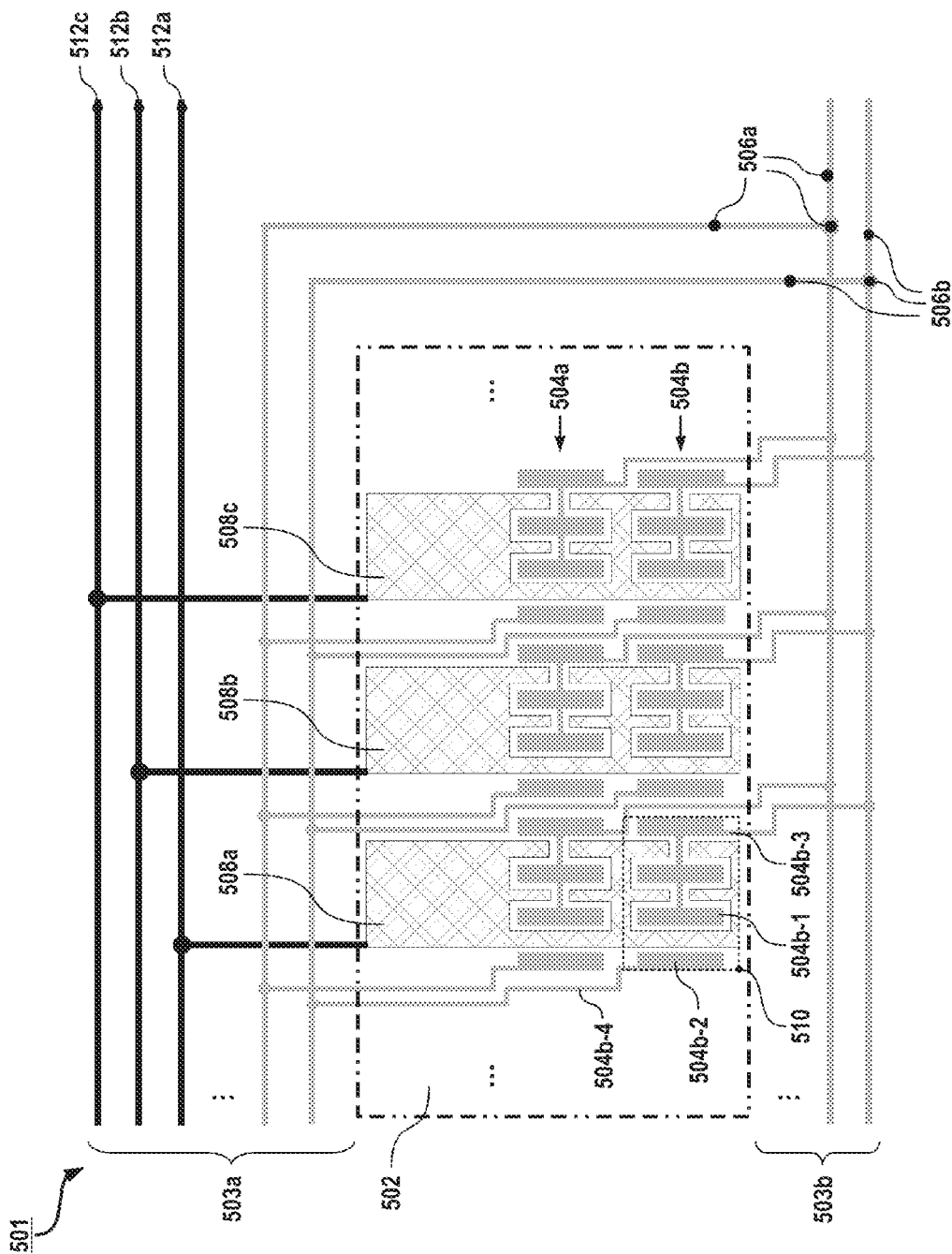
FIG. 5A illustrates a schematic diagram of a routing design for a touch sensor with a SLIM-H pattern according to an example embodiment.

FIG. 5A illustrates a schematic diagram of a routing design for a touch sensor with a SLIM-H pattern according to an example embodiment. In FIG. 5A, a portion of touch sensor 501 includes touch-sensing area 502 and non-sensing portions 503a (top) and 503b (bottom). It is noted that the ellipsis in FIG. 5A indicate that similar elements—such as traces, shaped portions, etc.—may be repeated for additional electrodes that are not shown in the figure.

In FIG. 5A, touch sensor 501 comprises an array of electrodes that is formed in the touch-sensing area 502. The array of electrodes includes RX electrodes (e.g., such as electrodes 504a, 504b) and TX electrodes (e.g., such as electrodes 508a, 508b, 508c). The RX electrodes and the TX electrodes are interleaved (e.g., interlaced) on the same (e.g., a single) substrate layer, but without intersecting each other and while maintaining electrical isolation from each other. The RX electrodes are arranged in rows and the TX electrodes are arranged in columns, where each of the rows includes one of the RX electrodes (e.g., 504a, or 504b, etc.), and each of the columns includes one of the TX electrodes (e.g., 508a, or 508b, or 508c, etc). Each TX electrode (e.g., 508a, 508b, 508c) is coupled to a corresponding secondary trace (e.g., 512a, 512b, 512c) in the non-sensing area of touch sensor 501. The various traces and shaped portions of each RX electrode are coupled together in the non-sensing area of touch sensor 501. For example, the shaped portions and the primary traces of RX electrode 504a are coupled together over secondary trace(s) 506a. Similarly, the shaped portions and the primary traces of RX electrode 504b are coupled together over secondary trace(s) 506b.

As illustrated in FIG. 5A, each of the RX electrodes includes several pairs with each pair having a substantially "H"-shaped portion and an opposing (e.g., substantially "I"-shaped) portion, where the two shaped portions in a given pair are disposed across one of the TX electrodes from each other to form a sensor element corresponding to that given pair. According to the techniques described herein, the two shaped portions in a given pair are connected to corresponding primary traces that are routed in different directions with respect to the edges of touch sensor 501. For example, sensor element 510 is formed by RX electrode 504b and TX electrode 508a. The "H"-shaped portion 504b-1 of RX electrode 504b is interleaved with a portion of TX electrode 508a, where the opposing shaped portion 504b-2 of RX electrode 504b is disposed across TX electrode 508a from the "H"-shaped portion 504b-1. The "H"-shaped portion 504b-1 is connected to primary trace 504b-3 that is routed in a downward direction (towards the bottom non-sensing portion 503b), while the opposing shaped portion 504b-2 is connected to primary trace 504b-4 that is routed in an upward direction (towards the top non-sensing portion 503a). Primary traces 504b-3 and 504b-4 are coupled together via secondary trace(s) 506b. As illustrated in FIG. 5A, RX electrode 504a includes similarly arranged "H"-shaped and opposing shaped portions and primary traces, which are coupled together via secondary trace(s) 506a in a similar manner.

During scan operations, the secondary traces 506a and 506b are coupled to (e.g., are in operable communication with) an electronic system (e.g., such as the system illustrated in FIG. 2) in order to receive signal values representing mutual capacitances from the sensor elements of touch sensor 501. In an example scan operation, touch sensor 501 is operated by providing a signal to each TX electrode in turn (e.g., via secondary traces 512a, 512b, or 512c, etc.), while grounding the remaining non-driven TX electrodes. Signals are induced in the RX electrodes that have shaped portions interleaved with the driven TX electrode because of the capacitive coupling therebetween. The signals induced in both the "H"-shaped portion and the opposing portion of a given RX electrode are measured and/or recorded by a processing logic in the electronic system together (because the shaped portions of each given RX electrode are coupled to each other in the non-sensing area of the touch sensor). The measured/recorded signals may change (from pre-determined baseline value(s)) due to the presence of a conductive object that is in contact with a portion of touch sensor 501. Signal changes (e.g., from baseline values) measured on the RX electrodes are indicative of change in the capacitance (e.g., in the "mutual capacitance") between one or more of the RX electrodes and the driven TX electrode. After measuring the signals on the RX electrodes, the scan operation continues by providing a signal to the next TX electrode and measuring the corresponding RX electrodes in the same manner. According to the techniques described herein, since the RX electrodes in touch sensor 501 are routed from both the top and the bottom non-sensing portions of the touch sensor, the response functions of the sensor elements formed by the RX electrodes are more symmetrical, which results in a smaller/minimum tail effect during the scan operations. As described below, in some embodiments such smaller/minimum tail effect can be eliminated by performing common noise-reduction operations on the signal values obtained by the scan operations.

Figure 5B:
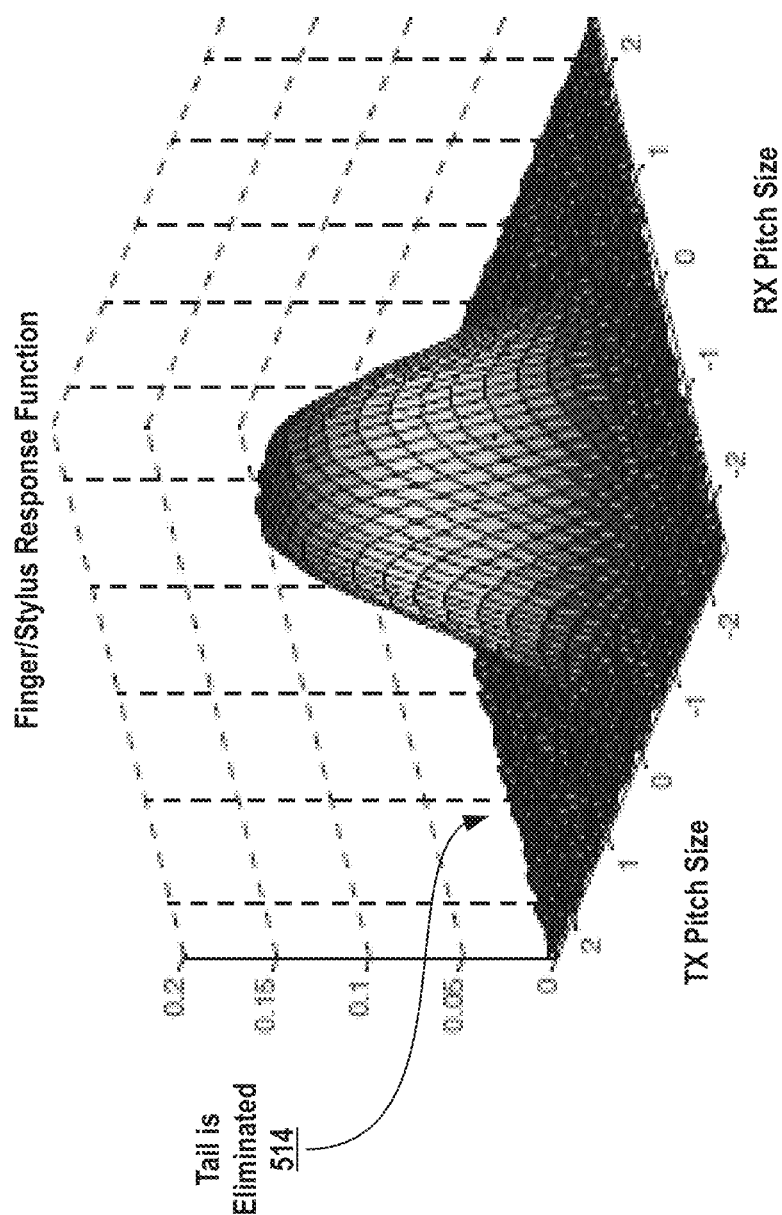
FIG. 5B illustrates a three-dimensional plot of predicted response functions for the sensor elements of a touch sensor, e.g., such as the touch sensor illustrated in FIG. 5A.

FIG. 5B illustrates a three-dimensional plot of predicted response functions for the sensor elements of a touch sensor, e.g., such as the touch sensor illustrated in FIG. 5A. In FIG. 5B, the response functions for all sensor elements may be viewed as the sensitivity map of a contact by a conductive object (e.g., such as a finger or a stylus) on touch sensor 501. As illustrated by reference numeral 514, the conductive object has not produced a tail effect (as contrasted to tail 414 in FIG. 4B).

According to the techniques described herein, in some embodiments the minimum/symmetrical tail effect of a single-layer touch sensor may be corrected/eliminated with a common mode filter. In such embodiments, a common mode filter may be implemented as a firmware operation that processes measurements (and/or diff signals derived from measurements) received by a processing logic from scan operation(s). It is noted, however, that a common mode filter may be implemented in various different ways in hardware, firmware, and/or a combination thereof, and for this reason the techniques described herein are not limited to any particular mechanism of implementing a common mode filter.

In conventional processing devices, a common mode filter corrects for common mode noise or bias (CMN or CMB). A common mode noise is typically noise from the display (e.g., such as LCD noise) that is positioned below the touch sensor, although various implementations may have various sources of common mode noise. In general, common mode noise is present for all sensor elements in a row/column equally because a display (or other source of common noise) injects undesired signal equally to all electrodes of the touch sensor. Thus, in conventional processing devices a common mode filter is used to successfully correct/eliminate common noise. The techniques for designs of single-layer touch sensors described herein leverage this property of common mode filters to correct for the minimum/symmetrical tail effect that may be present for such designs. Because the primary traces of the RX electrodes extend in both (e.g., opposing) directions on the touch sensor, any tail effect caused by contact from a conductive object is carried (at least partially) to all RX electrodes, thereby affecting (at least partially) all sensor elements formed by an RX electrode that is scanned during a scan operation. Thus, because of its symmetry, the tail effect can be treated like common mode noise and can be removed automatically, and along with, common mode noise without any additional or specific processing or algorithms that are dedicated to correcting tail effect.

For example, in some embodiments, a device may include a processing logic that is configured to perform a common mode filter operation on measurements (and/or diff signals derived from measurements) that are received from a scan operation on a given RX electrode in a single-layer touch sensor. The common mode filter operation can correct both common mode noise and a tail effect, which may be caused by contact from a conductive object that affects a shaped portion of the given RX electrode but is not in direct contact with one or more shaped portions of one or more different RX electrodes. The common mode filter operation may first compute the magnitude of the combined common mode noise and tail effect from the received and/or derived measurements by estimating it from signals that are first determined to be over a certain threshold and that are then averaged. The common mode filter operation may then generate corrected measurements (and/or corrected diff signals) by subtracting the magnitude of the combined common mode noise and tail effect from the received and/or derived measurements.

In some embodiments, the techniques for designs of single-layer touch sensors described herein may minimize tail effect and may make contact profiles more symmetrical by using some or more of the following:

a) shield the neighboring RX electrodes' routing from a given RX electrode by providing shaped portions of the given RX electrode on both sides of a TX electrode, where the shaped portions have substantially similar shape/width and thus provide shielding for the given RX electrode;

b) provide routing of opposing shaped portions of the RX electrodes in the direction opposite to the direction of the expected tail effect;

c) use different electrode patterns (e.g., replace an X-pattern with another pattern, such as an H-pattern) in order to increase a possibility of local maximum positioning correction.

Figure 6:
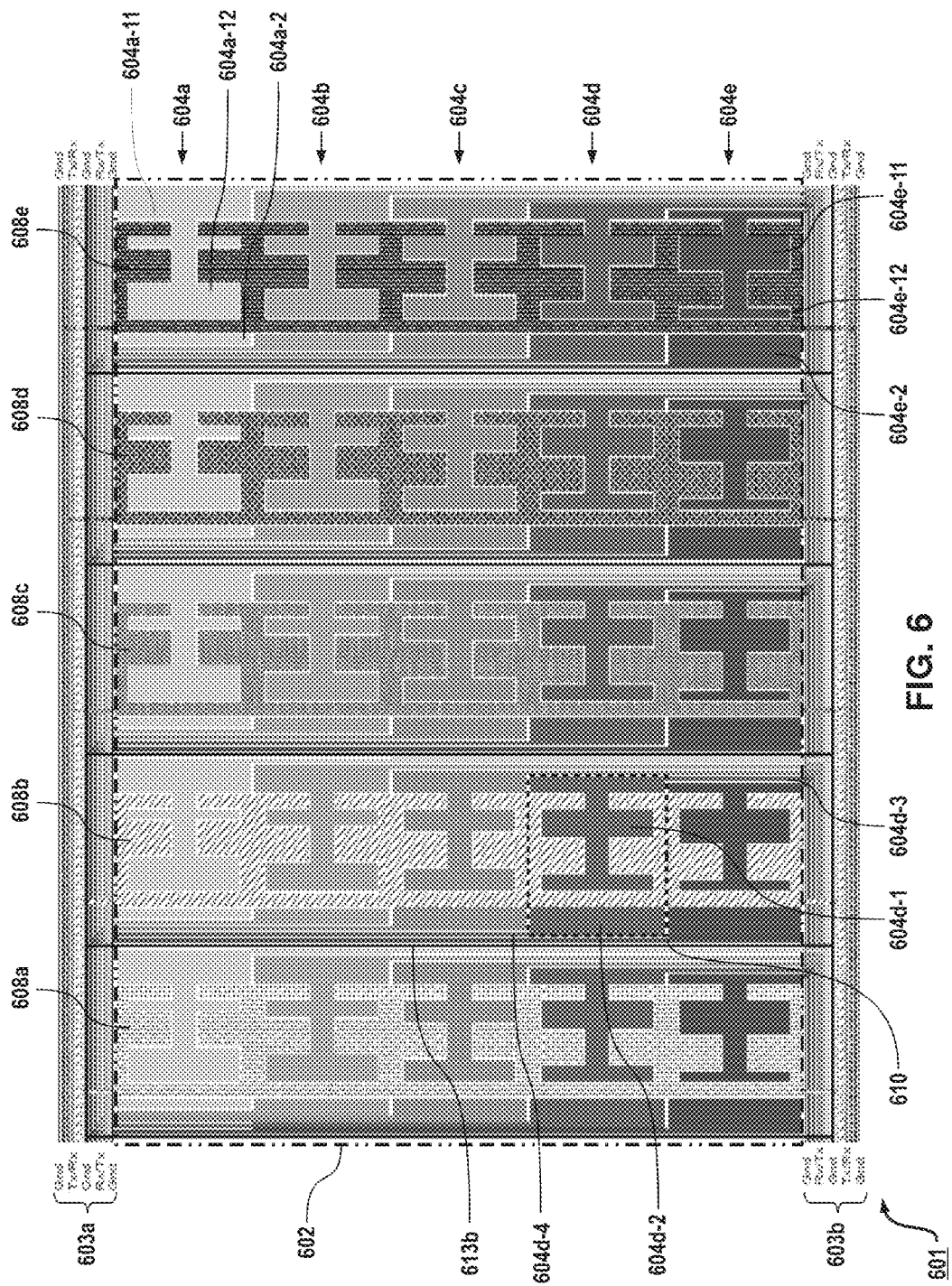
FIG. 6 illustrates an example touch sensor with an H2-pattern according to an example embodiment.

For example, in some embodiments a single-layer touch sensor design may include shield traces between RX electrodes and the TX electrode in neighboring sensor elements. Alternatively, or in addition, in some embodiments the shaped portions of RX electrodes may be arranged on both sides of a TX electrode to provide shielding. In cases where the tail effect goes in both directions, the width of the shaped portions of RX electrodes may be chosen in such way that any diff signals obtained from scan measurements would exhibit common mode bias. After a common mode filter is applied, no tails would be present in the profile of a contact on the touch sensor (e.g., as illustrated in FIG. 5B) and thus any typical positioning algorithms (e.g., such as centroid, Blais and Rioux (BR), linear interpolation without tail correction, etc.) may be applied to obtain the (e.g., x-y) position of the contact. In other cases, the electrode pattern itself may be used to improve the results of the positioning algorithms. For example, an H-pattern can be used to control the horizontal position (e.g., TX coordinate) of the local maximum by changing the width of the left and right bars of the H-shaped portion of the RX electrode (as illustrated in FIG. 6 below). Similarly, other electrode patterns (as illustrated in FIGS. 7-10 below) that provide simplified contact profiles may be used.

In this manner, the techniques described herein provide some or all of the following benefits:

a) when shielding is used, each RX electrode creates a shield from other RX electrodes and results in smaller tail effect;

b) the tail effect is symmetrical—thus, the contact coordinate(s) can be computed by using standard centroid/BR/linear interpolation algorithms;

c) the two sides of the tail effect result in common mode diff signal bias—thus, tail effect can be simply removed by a common mode filter along with common mode noise;

d) the area of RX and TX electrodes is constant—thus, any common mode noise (such as LCD noise) can be simply filtered out;

e) shielding does not need to be used between TX and RX routing.

It is noted that sensor designs according to the techniques described herein may be easily implemented for touch sensors that use DSD, SSD, and TP patterns.

FIG. 6 illustrates an example single-layer touch sensor with an H2-pattern according to an example embodiment. In FIG. 6, a portion of touch sensor 601 includes touch-sensing area 602 and non-sensing portions 603a (top) and 603b (bottom).

Touch sensor 601 comprises an array of electrodes that is formed in the touch-sensing area 602. The array of electrodes includes RX electrodes (e.g., such as electrodes 604a, 604b, 604c, 604d, 604e, etc.) and TX electrodes (e.g., such as electrodes 608a, 608b, 608c, 608d, 608e, etc). The RX electrodes and the TX electrodes are interleaved (e.g., interlaced) on the same (e.g., a single) substrate layer, but without intersecting each other and while maintaining electrical isolation from each other. The RX electrodes are arranged in rows and the TX electrodes are arranged in columns, where each of the rows includes one of the RX electrodes (e.g., 604a, or 604b, or 604c, or 604d, or 604e, etc.), and each of the columns includes one of the TX electrodes (e.g., 608a, or 608b, or 608c, or 608d, or 608e, etc). Each TX electrode (e.g., 608a, 608b, 608c, 608d, 608e, etc.) is coupled to a corresponding secondary trace in the non-sensing area(s) 603a and/or 603b of touch sensor 601. The various traces and shaped portions of each RX electrode are coupled together somewhere (not shown) in the non-sensing area(s) (e.g., 603a or 603b) of touch sensor 601. A set of ground traces is formed in the touch-sensing area 602, where each ground trace is routed to electrically isolate a given TX electrode from the immediately neighboring/adjacent primary traces that are connected to those shaped portions of the RX electrodes that are interleaved within a neighboring TX electrode. For example, ground trace 613b isolates TX electrode 608b from the primary traces connecting the "H"-shaped portions of the RX electrodes that are interleaved within TX electrode 608a.

As illustrated in FIG. 6, each of the RX electrodes includes several pairs with each pair having a substantially "H"-shaped portion and an opposing (e.g., substantially "I"-shaped) portion, where the two shaped portions in a given pair are disposed across one of the TX electrodes from each other to form a sensor element corresponding to that given pair. According to the techniques described herein, the two shaped portions in a given pair are connected to corresponding primary traces that are routed in different directions with respect to the edges of touch sensor 601. For example, sensor element 610 is formed by RX electrode 604d and TX electrode 608b. The "H"-shaped portion 604d-1 of RX electrode 604d is interleaved with a portion of TX electrode 608b, where the opposing shaped portion 604d-2 of RX electrode 604d is disposed across TX electrode 608b from the "H"-shaped portion 604d-1. The "H"-shaped portion 604d-1 is connected to primary trace 604d-3 that is routed in a downward direction (towards the bottom non-sensing portion 603b), while the opposing shaped portion 604d-2 is connected to primary trace 604d-4 that is routed in an upward direction (towards the top non-sensing portion 603a). Primary traces 604d-3 and 604d-4 are coupled together via secondary trace(s) somewhere in the non-sensing area of touch sensor 601. As illustrated in FIG. 6, RX electrodes 604a, 604b, 604c, and 604e include similarly arranged "H"-shaped and opposing shaped portions and primary traces, which are coupled together via secondary trace(s) in a similar manner in the non-sensing area of touch sensor 601.

In the embodiment illustrated in FIG. 6, the H-pattern of the RX electrodes can be used to affect the results for a local maximum diff signal that is caused by contact on touch sensor

601. The H-pattern may be such that the left and right bars of the "H"-shaped portion in any RX electrode can have different widths. Using RX electrode 604e as an example, the right bar 604e-11 is wider than the left bar 604e-12. It is noted that the width of the left and/or right bars may vary row by row (e.g., from RX electrode to an RX electrode in another row). For example, for RX electrode 604a, the left bar 604a-12 is wider than the right bar 604a-11. However, as illustrated in FIG. 6, the right bar 604e-11 of RX electrode 604e is wider than the right bar 604a-11 of RX electrode 604a, while the left bar 604a-12 of RX electrode 604a is wider than the left bar 604e-12 of RX electrode 604e. Further, in the embodiment illustrated in FIG. 6, the shaped portions of a given RX electrode in a given row have different widths and/or heights than the shaped portions of RX electrodes in the other rows. For example, the opposing shaped portion 604e-2 of RX electrode 604e is wider than the opposing shaped portion 604a-2 of RX electrode 604a.

Figure 7:
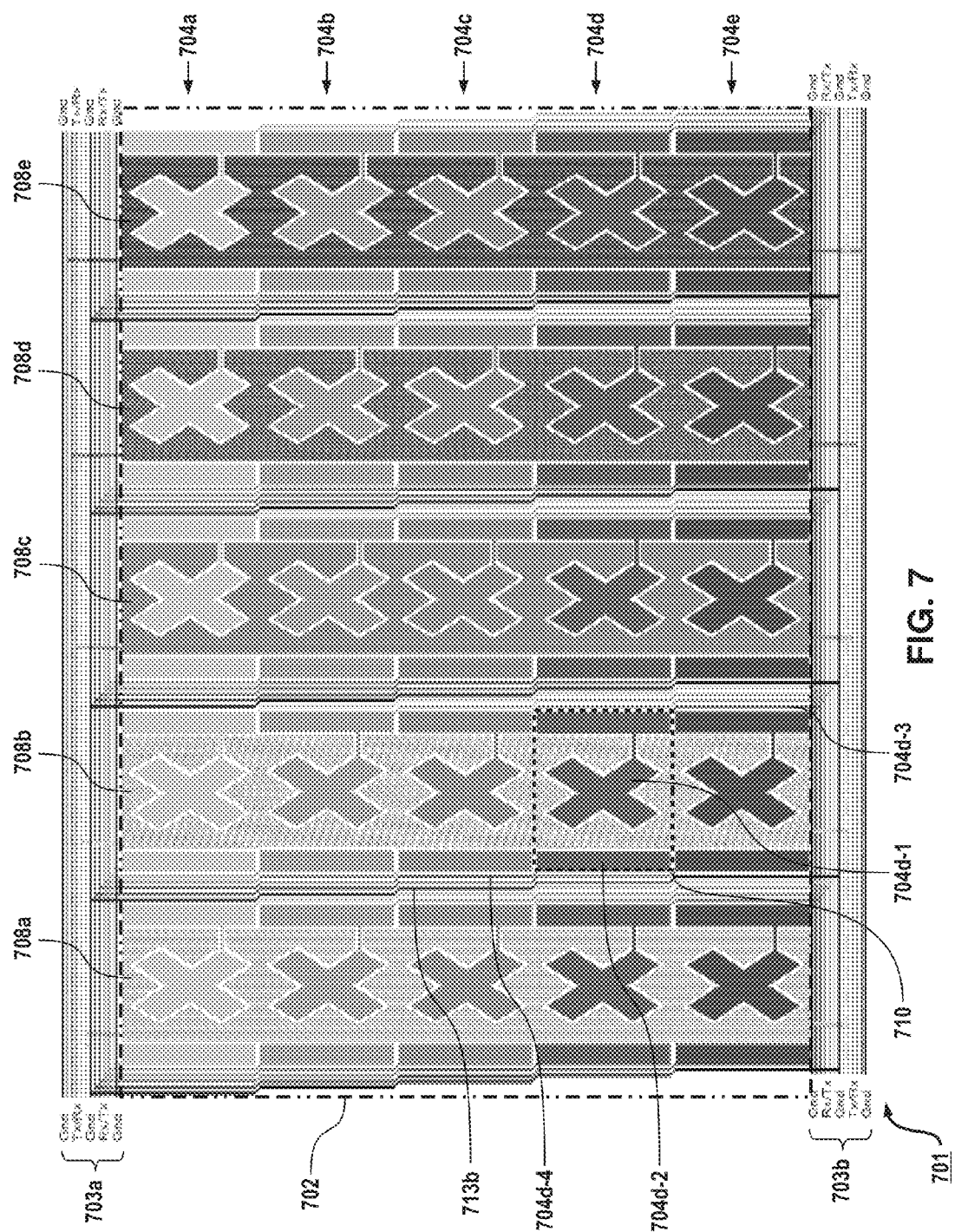
FIG. 7 illustrates an example touch sensor with an X-pattern according to an example embodiment.

FIG. 7 illustrates an example touch sensor with an X-pattern according to an example embodiment. In FIG. 7, a portion of touch sensor 701 includes touch-sensing area 702 and non-sensing portions 703a (top) and 703b (bottom).

Touch sensor 701 comprises an array of electrodes that is formed in the touch-sensing area 702. The array of electrodes includes RX electrodes (e.g., such as electrodes 704a, 704b, 704c, 704d, 704e, etc.) and TX electrodes (e.g., such as electrodes 708a, 708b, 708c, 708d, 708e, etc). The RX electrodes and the TX electrodes are interleaved (e.g., interlaced) on the same (e.g., a single) substrate layer, but without intersecting each other and while maintaining electrical isolation from each other. The RX electrodes are arranged in rows and the TX electrodes are arranged in columns, where each of the rows includes one of the RX electrodes (e.g., 704a, or 704b, or 704c, or 704d, or 704e, etc.), and each of the columns includes one of the TX electrodes (e.g., 708a, or 708b, or 708c, or 708d, or 708e, etc). Each TX electrode (e.g., 708a, 708b, 708c, 708d, 708e, etc.) is coupled to a corresponding secondary trace in the non-sensing area(s) 703a and/or 703b of touch sensor 701. The various traces and shaped portions of each RX electrode are coupled together somewhere (not shown) in the non-sensing area(s) (e.g., 703a or 703b) of touch sensor 701. A set of ground traces is formed in the touch-sensing area 702, where each ground trace is routed to electrically isolate a given TX electrode from the immediately neighboring/adjacent primary traces that are connected to those shaped portions of the RX electrodes that are interleaved within a neighboring TX electrode. For example, ground trace 713b isolates TX electrode 708b from the primary traces connecting the "X"-shaped portions of the RX electrodes that are interleaved within TX electrode 708a.

As illustrated in FIG. 7, each of the RX electrodes includes several pairs with each pair having a substantially "X"-shaped portion and an opposing (e.g., substantially "I"-shaped) portion, where the two shaped portions in a given pair are disposed across one of the TX electrodes from each other to form a sensor element corresponding to that given pair. According to the techniques described herein, the two shaped portions in a given pair are connected to corresponding primary traces that are routed in different directions with respect to the edges of touch sensor 701. For example, sensor element 710 is formed by RX electrode 704d and TX electrode 708b. The "X"-shaped portion 704d-1 of RX electrode 704d is interleaved with a portion of TX electrode 708b, where the opposing shaped portion 704d-2 of RX electrode 704d is disposed across TX electrode 708b from the "X"-shaped portion 704d-1. The "X"-shaped portion 704d-1 is connected to primary trace 704d-3 that is routed in a downward direction (towards the bottom non-sensing portion 703b), while the opposing shaped portion 704d-2 is connected to primary trace 704d-4 that is routed in an upward direction (towards the top non-sensing portion 703a). Primary traces 704d-3 and 704d-4 are coupled together via secondary trace(s) somewhere in the non-sensing area of touch sensor 701. As illustrated in FIG. 7, RX electrodes 704a, 704b, 704c, and 704e include similarly arranged "X"-shaped and opposing shaped portions and primary traces, which are coupled together via secondary trace(s) in a similar manner in the non-sensing area of touch sensor 701.

Figure 8:
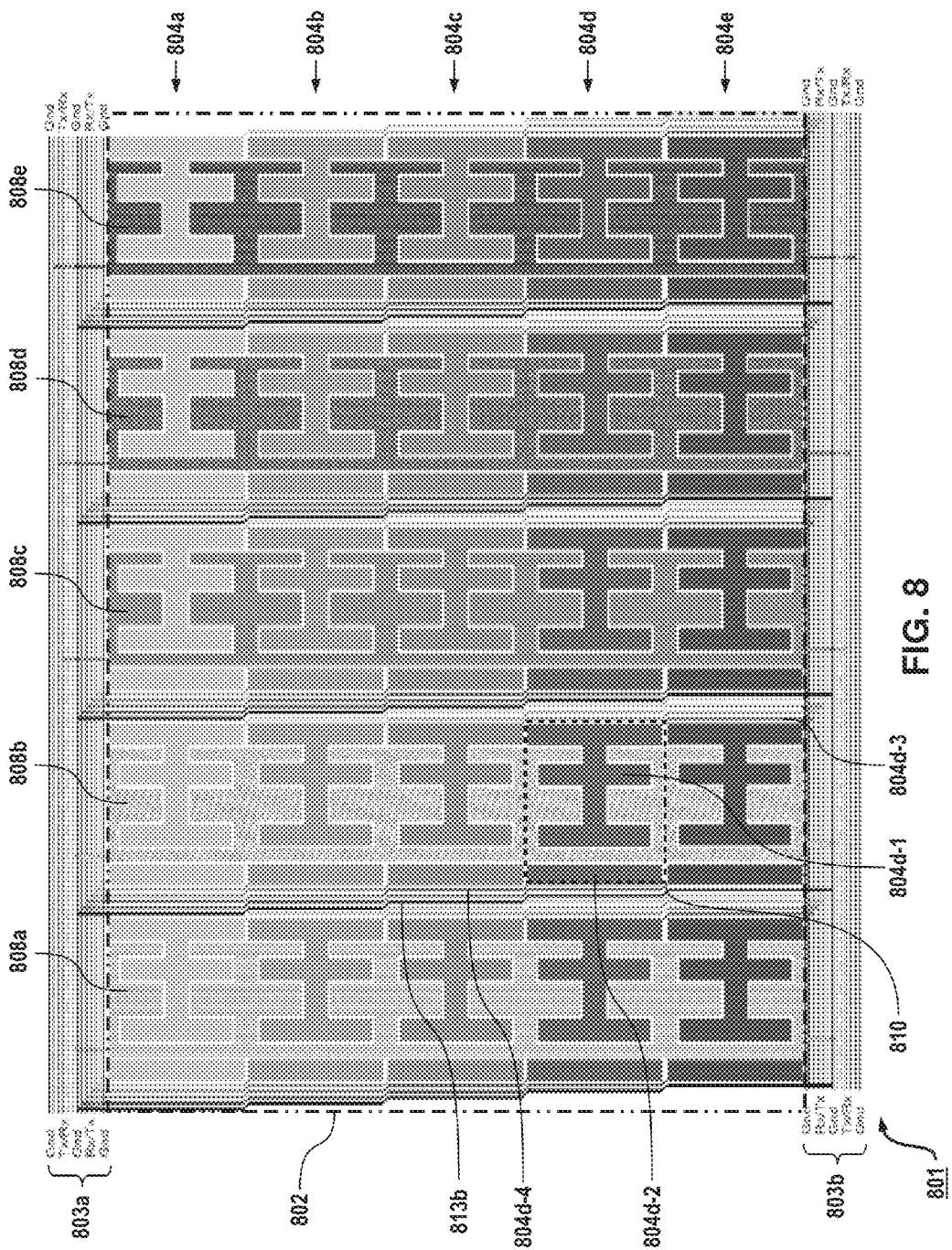
FIG. 8 illustrates an example touch sensor with an H-pattern according to an example embodiment.

FIG. 8 illustrates an example touch sensor with a different H-pattern according to an example embodiment. In FIG. 8, a portion of touch sensor 801 includes touch-sensing area 802 and non-sensing portions 803a (top) and 803b (bottom).

Touch sensor 801 comprises an array of electrodes that is formed in the touch-sensing area 802. The array of electrodes includes RX electrodes (e.g., such as electrodes 804a, 804b, 804c, 804d, 804e, etc.) and TX electrodes (e.g., such as electrodes 808a, 808b, 808c, 808d, 808e, etc). The RX electrodes and the TX electrodes are interleaved (e.g., interlaced) on the same (e.g., a single) substrate layer, but without intersecting each other and while maintaining electrical isolation from each other. The RX electrodes are arranged in rows and the TX electrodes are arranged in columns, where each of the rows includes one of the RX electrodes (e.g., 804a, or 804b, or 804c, or 804d, or 804e, etc.), and each of the columns includes one of the TX electrodes (e.g., 808a, or 808b, or 808c, or 808d, or 808e, etc). Each TX electrode (e.g., 808a, 808b, 808c, 808d, 808e, etc.) is coupled to a corresponding secondary trace in the non-sensing area(s) 803a and/or 803b of touch sensor 801. The various traces and shaped portions of each RX electrode are coupled together somewhere (not shown) in the non-sensing area(s) (e.g., 803a or 803b) of touch sensor 801. A set of ground traces is formed in the touch-sensing area 802, where each ground trace is routed to electrically isolate a given TX electrode from the immediately neighboring/adjacent primary traces that are connected to those shaped portions of the RX electrodes that are interleaved within a neighboring TX electrode. For example, ground trace 813b isolates TX electrode 808b from the primary traces connecting the "H"-shaped portions of the RX electrodes that are interleaved within TX electrode 808a.

As illustrated in FIG. 8, each of the RX electrodes includes several pairs with each pair having a substantially "H"-shaped portion and an opposing (e.g., substantially "I"-shaped) portion, where the two shaped portions in a given pair are disposed across one of the TX electrodes from each other to form a sensor element corresponding to that given pair. According to the techniques described herein, the two shaped portions in a given pair are connected to corresponding primary traces that are routed in different directions with respect to the edges of touch sensor 801. For example, sensor element 810 is formed by RX electrode 804d and TX electrode 808b. The "H"-shaped portion 804d-1 of RX electrode 804d is interleaved with a portion of TX electrode 808b, where the opposing shaped portion 804d-2 of RX electrode 804d is disposed across TX electrode 808b from the "H"-shaped portion 804d-1. The "H"-shaped portion 804d-1 is connected to primary trace 804d-3 that is routed in a downward direction (towards the bottom non-sensing portion 803b), while the opposing shaped portion 804d-2 is connected to primary trace 804d-4 that is routed in an upward direction (towards the top non-sensing portion 803a). Primary traces 804d-3 and 804d-4 are coupled together via secondary trace(s) somewhere in the non-sensing area of touch sensor 801. As illustrated in FIG. 8, RX electrodes 804a, 804b, 804c, and 804e include similarly arranged "H"-shaped and opposing shaped portions and primary traces, which are coupled together via secondary trace(s) in a similar manner in the non-sensing area of touch sensor 801.

Figure 9:
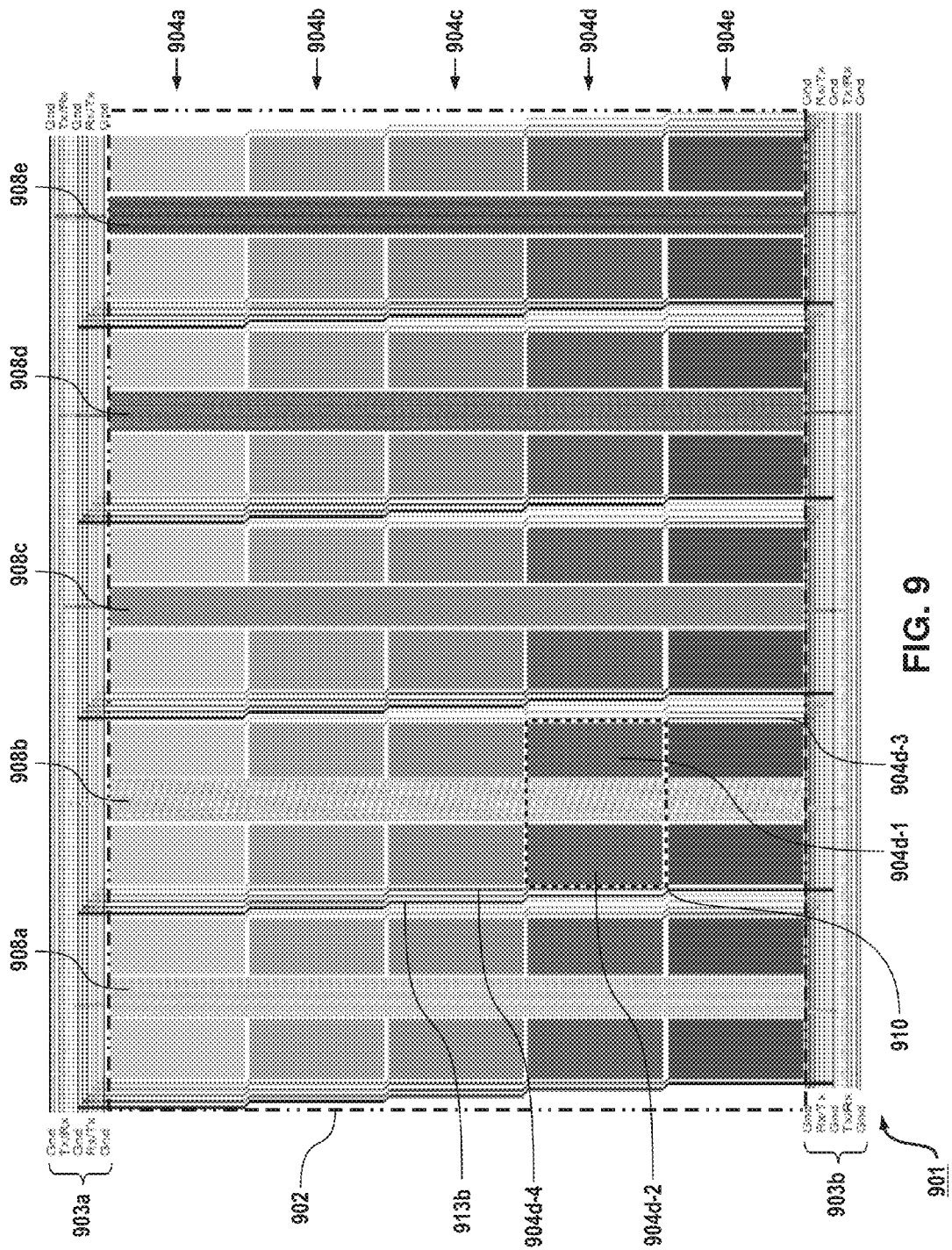
FIG. 9 illustrates an example touch sensor with an I-pattern according to an example embodiment.

FIG. 9 illustrates an example touch sensor with an I-pattern according to an example embodiment. In FIG. 9, a portion of touch sensor 901 includes touch-sensing area 902 and non-sensing portions 903a (top) and 903b (bottom).

Touch sensor 901 comprises an array of electrodes that is formed in the touch-sensing area 902. The array of electrodes includes RX electrodes (e.g., such as electrodes 904a, 904b, 904c, 904d, 904e, etc.) and TX electrodes (e.g., such as electrodes 908a, 908b, 908c, 908d, 908e, etc). The RX electrodes and the TX electrodes are interleaved (e.g., interlaced) on the same (e.g., a single) substrate layer, but without intersecting each other and while maintaining electrical isolation from each other. The RX electrodes are arranged in rows and the TX electrodes are arranged in columns, where each of the rows includes one of the RX electrodes (e.g., 904a, or 904b, or 904c, or 904d, or 904e, etc.), and each of the columns includes one of the TX electrodes (e.g., 908a, or 908b, or 908c, or 908d, or 908e, etc). Each TX electrode (e.g., 908a, 908b, 908c, 908d, 908e, etc.) is coupled to a corresponding secondary trace in the non-sensing area(s) 903a and/or 903b of touch sensor 901. The various traces and shaped portions of each RX electrode are coupled together somewhere (not shown) in the non-sensing area(s) (e.g., 903a or 903b) of touch sensor 901. A set of ground traces is formed in the touch-sensing area 902, where each ground trace is routed to electrically isolate a given TX electrode from the immediately neighboring/adjacent primary traces that are connected to those shaped portions of the RX electrodes that are interleaved within a neighboring TX electrode. For example, ground trace 913b isolates TX electrode 908b from the primary traces connecting the "I"-shaped portions of the RX electrodes that are interleaved within TX electrode 908a.

As illustrated in FIG. 9, each of the RX electrodes includes several pairs with each pair having a substantially "I"-shaped portion and an opposing (e.g., also substantially "I"-shaped) portion, where the two shaped portions in a given pair are disposed across one of the TX electrodes from each other to form a sensor element corresponding to that given pair. According to the techniques described herein, the two shaped portions in a given pair are connected to corresponding primary traces that are routed in different directions with respect to the edges of touch sensor 901. For example, sensor element 910 is formed by RX electrode 904d and TX electrode 908b. The "I"-shaped portion 904d-1 of RX electrode 904d is interleaved with a portion of TX electrode 908b, where the opposing shaped portion 904d-2 of RX electrode 904d is disposed across TX electrode 908b from the "I"-shaped portion 904d-1. The "I"-shaped portion 904d-1 is connected to primary trace 904d-3 that is routed in a downward direction (towards the bottom non-sensing portion 903b), while the opposing shaped portion 904d-2 is connected to primary trace 904d-4 that is routed in an upward direction (towards the top non-sensing portion 903a). Primary traces 904d-3 and 904d-4 are coupled together via secondary trace(s) somewhere in the non-sensing area of touch sensor 901. As illustrated in FIG. 9, RX electrodes 904a, 904b, 904c, and 904e include similarly arranged "I"-shaped and opposing shaped portions and primary traces, which are coupled together via secondary trace(s) in a similar manner in the non-sensing area of touch sensor 901.

Figure 10:
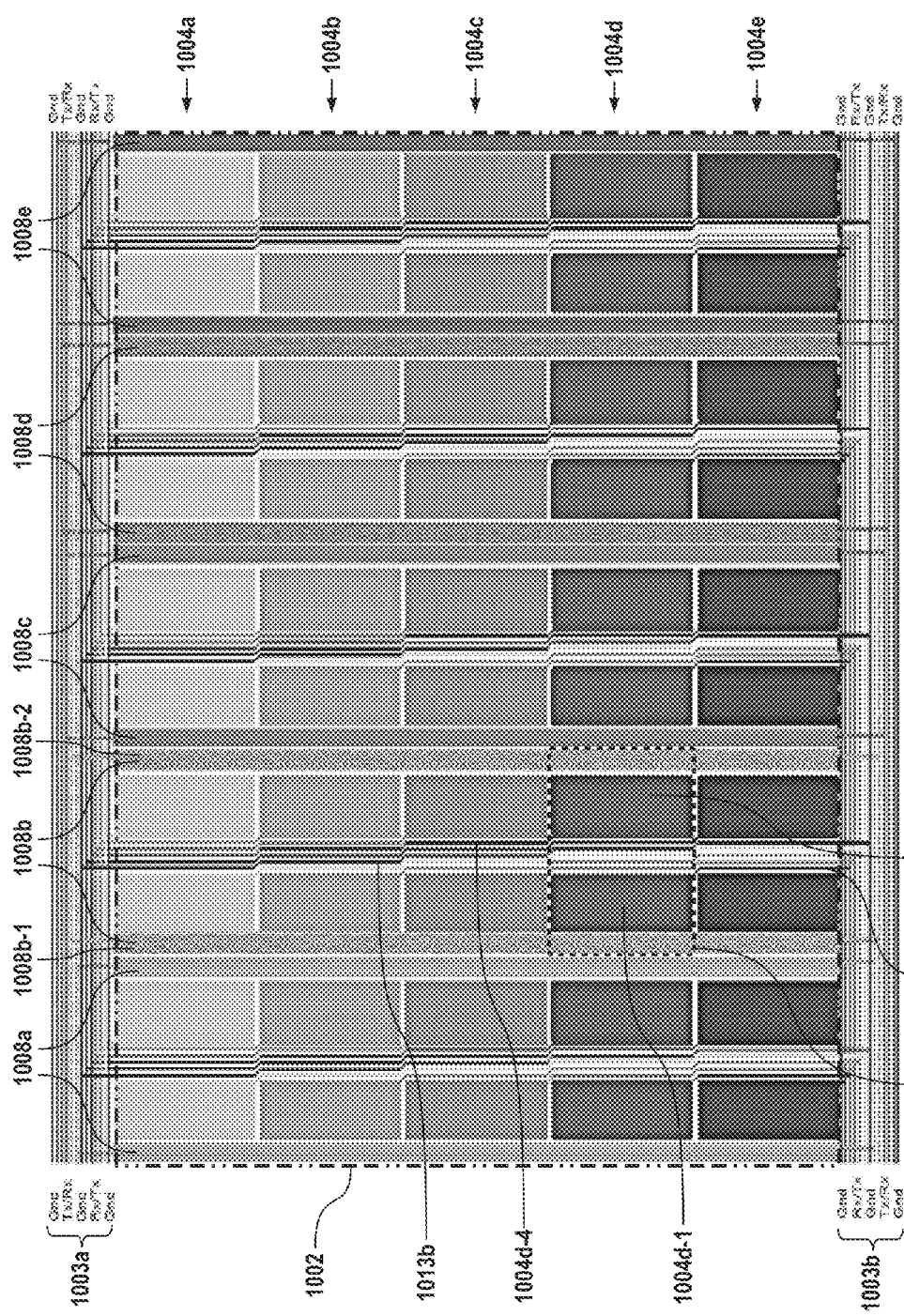
FIG. 10 illustrates an example touch sensor with another I-pattern according to an example embodiment.

FIG. 10 illustrates an example touch sensor with a different I-pattern having double-portioned TX electrodes and double-portioned RX electrodes, which works well for touch sensors that are intended to detect contacts from small fingers and other small conductive objects. In FIG. 10, a portion of touch sensor 1001 includes touch-sensing area 1002 and non-sensing portions 1003a (top) and 1003b (bottom).

Touch sensor 1001 comprises an array of electrodes that is formed in the touch-sensing area 1002. The array of electrodes includes RX electrodes (e.g., such as electrodes 1004a, 1004b, 1004c, 1004d, 1004e, etc.) and TX electrodes (e.g., such as electrodes 1008a, 1008b, 1008c, 1008d, 1008e, etc). The RX electrodes and the TX electrodes are interleaved (e.g., interlaced) on the same (e.g., a single) substrate layer, but without intersecting each other and while maintaining electrical isolation from each other. The RX electrodes are arranged in rows and the TX electrodes are arranged in columns, where each of the rows includes one of the RX electrodes (e.g., 1004a, or 1004b, or 1004c, or 1004d, or 1004e, etc.), and each of the columns includes one of the TX electrodes (e.g., 1008a, or 1008b, or 1008c, or 1008d, or 1008e, etc). Each TX electrode comprises two separate portions that extend from the top to the bottom of touch-sensing area 1002. For example, TX electrode 1008b includes a left portion 1008b-1 and a right portion 1008b-2. The portions of each TX electrode (e.g., 1008a, 1008b, 1008c, 1008d, 1008e, etc.) are coupled to corresponding secondary trace(s) in the non-sensing area(s) 1003a and/or 1003b of touch sensor 1001. The various traces and shaped portions of each RX electrode are coupled together somewhere (not shown) in the non-sensing area(s) (e.g., 1003a or 1003b) of touch sensor 1001. A set of ground traces is formed in the touch-sensing area 1002. For example, ground trace 1013b runs between the two portions 1008b-1 and 1008b-2 of TX electrode 1008b and separates the primary traces of the "I"-shaped portions of the RX electrodes that extend downward (to bottom area 1003b) from the primary traces of the "I"-shaped portions of the RX electrodes that extend upward (to top area 1003a).

As illustrated in FIG. 10, each of the RX electrodes includes several pairs with each pair having a substantially "I"-shaped portion and an opposing (e.g., also substantially "I"-shaped) portion, where the two shaped portions in a given pair are disposed between the portions of one of the TX electrodes to form a sensor element corresponding to that given pair. According to the techniques described herein, the two shaped portions of an RX electrode in a given pair are connected to corresponding primary traces that are routed in different directions with respect to the edges of touch sensor 1001. For example, sensor element 1010 is formed by RX electrode 1004d and TX electrode 1008b. The "I"-shaped portion 1004d-1 of RX electrode 1004d is disposed to the right of portion 1008b-1 of TX electrode 1008b, and the opposing "I"-shaped portion 1004d-2 of RX electrode 1004d is disposed to the left of portion 1008b-2 of TX electrode 1008b. The "I"-shaped portion 1004d-1 is connected to primary trace 1004d-3 that is routed in a downward direction (towards the bottom non-sensing portion 1003b), while the opposing "I"-shaped portion 1004d-2 is connected to primary trace 1004d-4 that is routed in an upward direction (towards the top non-sensing portion 1003a). Primary traces 1004d-3 and 1004d-4 are coupled together via secondary trace(s) somewhere in the non-sensing area of touch sensor 1001. As illustrated in FIG. 10, RX electrodes 1004a, 1004b, 1004c, and 1004e include similarly arranged "I"-shaped and opposing shaped portions and primary traces, which are coupled together via secondary trace(s) in a similar manner in the non-sensing area of touch sensor 1001.

In some embodiments, ground traces between TX electrodes and RX electrodes may not be needed. A ground trace (e.g., such as ground trace 913b in FIG. 9) is typically used to separate a given TX electrode from sensor elements formed by portions of RX electrode(s) that are interleaved within neighboring TX electrodes, thereby avoiding capacitive coupling of the given TX electrode to such sensor elements. However, according to the techniques described herein, such ground traces are not necessary in at least some of the single-layer touch sensor designs described herein. One reason for this is that according to the techniques described herein, a sensor element includes two portions of the same RX electrode with each portion being routed over a corresponding primary trace in a different (e.g., opposing) direction. Thus, the shaped portions of the RX electrode act as shields in a similar manner as the ground traces. Another reason is that the portions of the RX electrode may be shaped in such way as to reduce the tail effect without a ground shield.

The widths of the primary (and other) traces of RX electrodes in single-layer touch sensors are typically defined by the manufacturing process. For example, in some embodiments the minimal trace width that can be provided by the manufacturer is in the range of 30-70 microns, and the maximum trace width may vary depending on the space available for routing on the touch sensor and on the desired/expected sensor characteristics. It is noted, however, that wider primary traces typically produce a relatively bigger tail effect.

According to the techniques described herein, in various embodiments specific sensor-related parameters may be selected in such way as to minimize the tail effect. Examples of such parameters include glass/overlay thickness, number and thickness of TX and RX electrodes, and type of RX (and/or TX) patterns.

For example, in some embodiments the variation of the overlay (e.g., glass) thickness may affect the magnitude of the tail effect because less thick glass increases the capacitive-based signal for each sensor element, but also increases the tail effect. Typically, a thicker glass is desirable only to provide mechanical strength of the stack-up including the touch sensor.

In some embodiments the thickness of RX electrodes may vary within a pattern for each row of the touch sensor array, which allows for design-based adjustment of the sensitivity of each row. As a general rule, the edges of a touch sensor should have electrodes with wider patterns or have a gradient of the signal from one edge to the other, which can be achieved by varying the width of the electrodes from row-to-row and/or column-to-column. In some embodiments, the number of RX and TX electrodes in a touch sensor depends on the size of the touch panel and how much space is available for the touch-sensing area. An example pitch of a touch sensor is typically in the range of 4-6 mm, where in a 6 mm pitch it is typical to dedicate 30% of the touch-sensing area for routing traces that are approximately 1.5 mm wide. Further, in some embodiments the number of rows and columns of RX and TX electrodes may also depend on the type of the touch controller because the number of IO pins on the touch controller may determine how many rows/columns of electrodes can be scanned.

In some embodiments, the type of RX/TX pattern used on a single-layer touch sensor may depend on the available or desired manufacturing process. Since the TX and RX electrodes of a single-layer touch sensor are interleaved on the same layer of the substrate, manufacturing more complex electrode shapes requires more accurate tools, and more complex electrode shapes increases the chances for shorts. Of the various electrode patterns that can be used according to the techniques described herein, an I-pattern is the easiest to manufacture because this pattern renders itself less likely to suffer from shorts caused by manufacturing inaccuracies/errors.

Examples of Additional Features and Alternative Embodiments

It is noted that various modifications and changes can be made to the electrode patterns described heretofore without departing from the scope of the techniques described herein. For example, electrode shapes may be modified from substantially rectangular to pentagon or octagon shapes, for instance, with touch sensor performance remaining relatively the same. Also, extensions of electrodes can be made with curved boundaries.

Further, some embodiments may use various other electrode shapes and patterns such as, for example, triangular, sector, and one-fold spiral shapes and patterns. Examples of such alternative electrode shapes and patterns are illustrated in FIGS. 11A-11D.

Figures 11A, 11B:
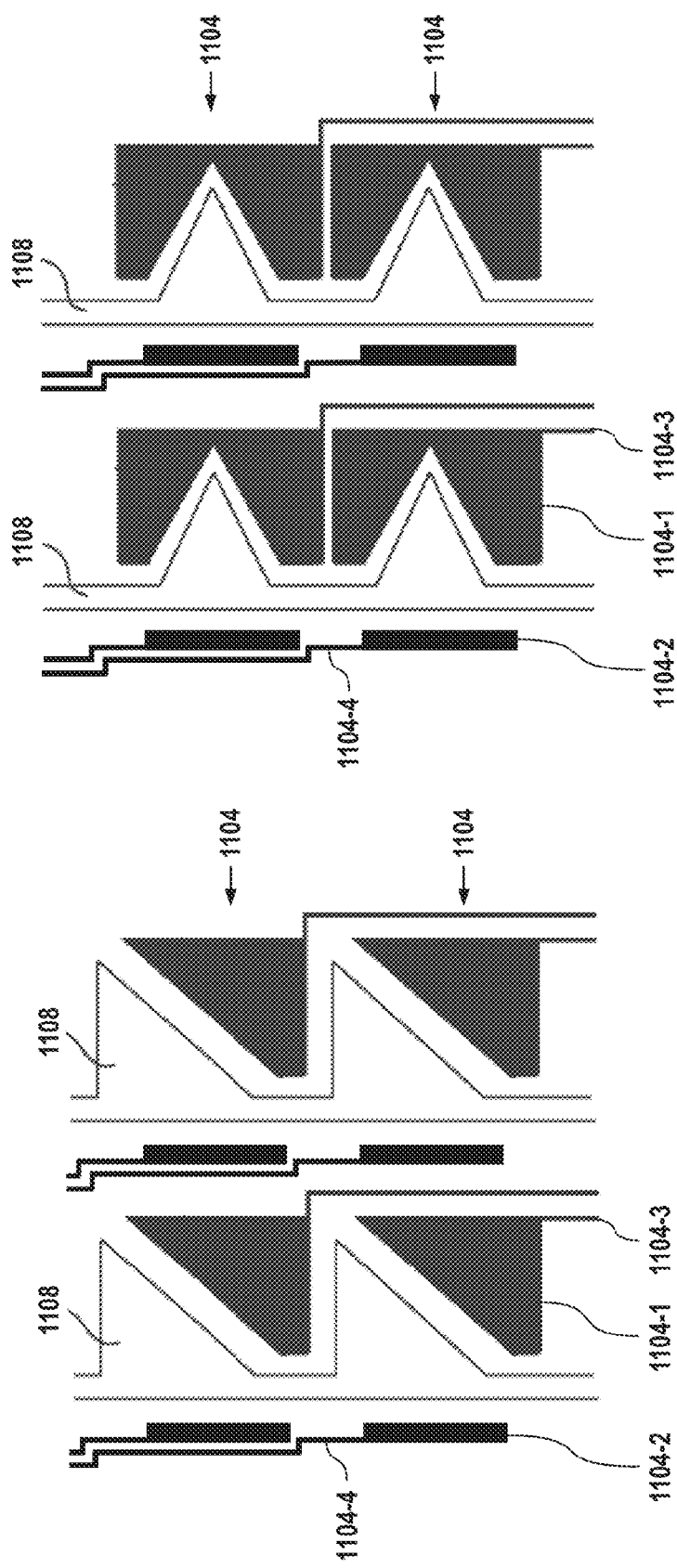
FIGS. 11A, 11B, 11C, and 11D illustrate examples of single-layer touch sensors with alternative patterns of sensor electrodes according to various embodiments.
Figures 11C, 11D:
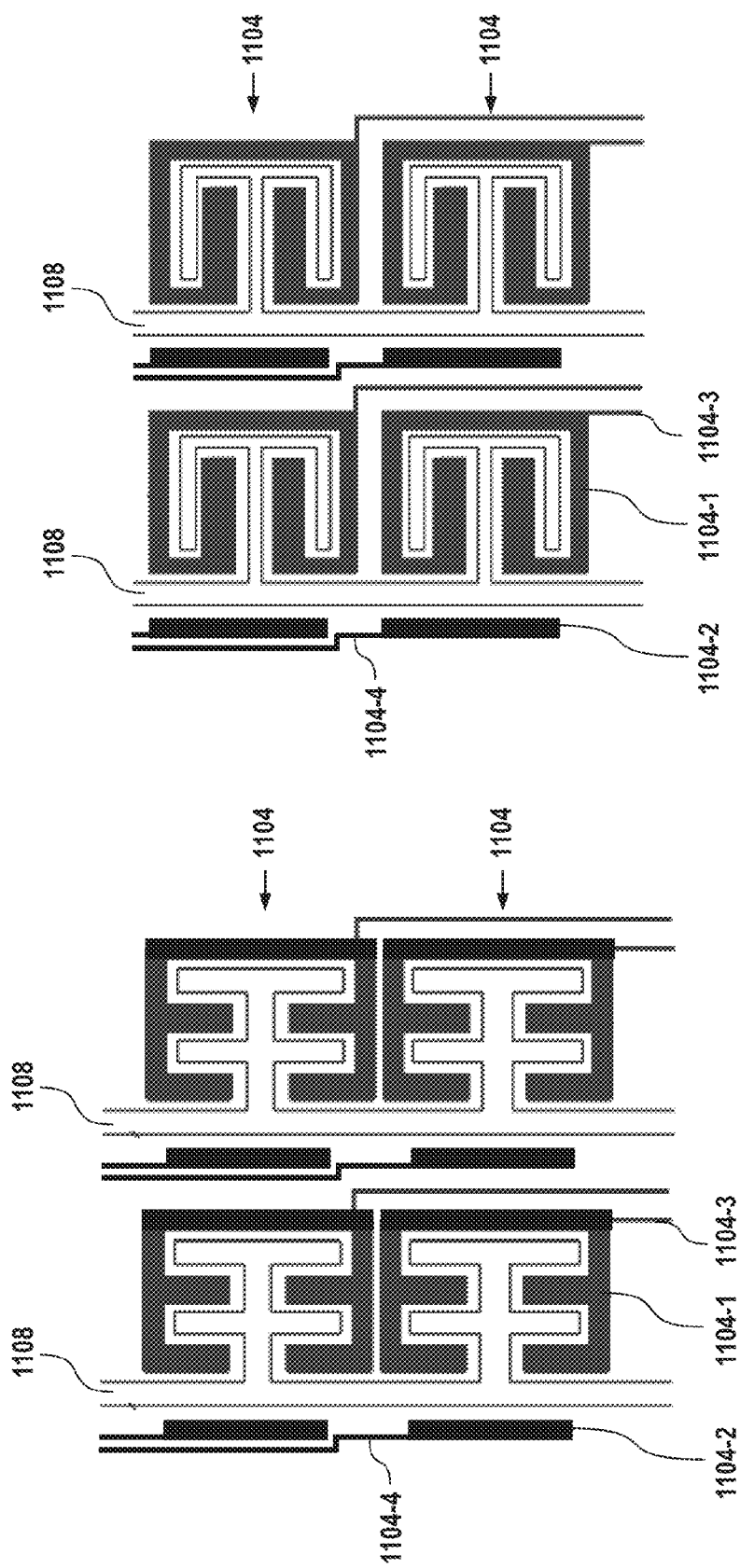

FIGS. 11A-D illustrate alternative shapes, patterns, and arrangements of TX electrodes 1108 and RX electrodes 1104 with their shaped portions 1104-1, opposing portions 1104-2, and primary traces 1104-3 and 1104-4 that extend in opposite directions, according to various embodiments of the techniques described herein. For example, the embodiment of FIG. 11A illustrates RX electrodes 1104 that have substantially triangular shaped portions 1104-1 and substantially "T"-shaped opposing portions 1104-2. The embodiment of FIG. 11B illustrates RX electrodes 1104 that have substantially double-trapezoid shaped portions 1104-1 and substantially "T"-shaped opposing portions 1104-2. The embodiment of FIG. 11C illustrates TX electrodes 1108 that are interleaved with the RX electrodes 1104 in a substantially "H"-shaped pattern, and the embodiment in FIG. 11D illustrates TX electrodes 1108 that are interleaved with the RX electrodes 1104 in a substantially "Ǝ"-shaped pattern. However, it should be understood that other shapes, patterns, and arrangements may be used such as, for example "M"-shaped electrode patterns, "N"-shaped electrode patterns, and others. For this reason, the embodiments illustrated in FIGS. 11A, 11B, 11C, and 11D are to be regarded in an illustrative rather than a restrictive sense.

In some embodiments, the single-layer touch sensors described herein can be used for sensing various conductive (e.g., metal) objects in various applications. For example, the touch sensors described herein can be used to improve sensitivity of measurement in industrial and biomedical applications. Performance improvement with the techniques described herein might be comparable to use of other interleaved sensors built with one layer of ITO.

In some embodiments, the two shaped portions of a given RX electrode are coupled to each other (e.g., over corresponding primary and secondary traces) in the bezel of the touch sensor. However, the two shaped portions of a given RX electrode can also be coupled outside of the bezel or even outside of the touch sensor altogether. For example, some embodiments may use two connectors/pins on the top and the bottom of the touch sensor that are coupled over PCB lines. An example of such arrangement may be used in tablets that can have 2-4 tails for each electrode on each side, where the two/four lines for a given RX electrode are coupled to the same pin on the PCB. In other embodiments, a common electronics component (e.g., a chip) can be used to couple together the traces connected to the two shaped portions of a given RX electrode. An example of such arrangement may be found in embodiments using touch controllers that do not have a limited number of pins.

In some embodiments, different materials may be used to form the touch sensor (e.g., RX and TX) electrodes, such as copper, aluminum, silver, or any suitable conductive material that may be appropriately patterned. Furthermore, an FPC may be used to form the sensor electrodes. In such embodiments, the various conductive layers in the FPC may be appropriately configured to form the array of TX and RX electrodes as described above, as well as to form the primary traces thereof. As such, it should be understood that the electrodes, the traces, and the insulating material (or body) may all be formed by a single, appropriately configured FPC. As will be appreciated by one skilled in the art, such embodiments may be particularly applicable to non-transparent devices, such as mouse pads, track pads, touch pads, etc. Additionally, in some embodiments, the substrate may be made of other materials, such as any suitable plastic, including vinyl and polyamide, which may not be transparent, depending on the particular device.

In some embodiments, a touch sensor may be formed by laying out the sensor electrodes using alternative conductive materials such as metal mesh. In such embodiments, the sensor electrodes are formed by disposing metal mesh electrodes on PET substrate. In alternative embodiments, the metal mesh sensor electrodes may be disposed on glass substrate. In other embodiments, the sensor electrodes may be formed with silver nano-wires on PET or silver nano-wire on glass substrate. In other embodiments, a touch sensor may be formed by bonding a glass (or other transparent insulating) lens onto another glass with the sensor electrode pattern disposed on. In yet other embodiments, the touch sensor may be formed by bonding glass (or other transparent insulating material) onto a sheet of PET containing the sensor pattern.

In some embodiments, a single-layer structure may be used in the active area of the touch sensor, while a multi-layer structure may be used in the bezel (or other non-sensing) portions of the touch sensor for routing the secondary traces. Such multi-layer secondary routing allows the repeated use of the secondary traces so that the touch sensor uses the minimum number of traces and the minimum number of pins on the electronic system which drives the touch sensor, thereby reducing the associated manufacturing costs.

In some embodiments, the techniques described herein may be used not only for mutual-capacitance touch sensors, but also for touch-sensors that can operate in self-capacitance mode and/or in mixed mutual-capacitance/self-capacitance mode. Such application of the techniques described herein is possible for self-capacitance touch sensors because they also provide multiple sensor elements that can be measured and that can produce a signal profile that can be analyzed.

Various embodiments of the techniques for design of single-layer touch sensors described herein may include or use various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may include or use operations that are implemented as a computer program product that may include instructions stored on a non-transitory computer-readable medium, e.g., such as volatile storage and/or non-volatile storage. These instructions may be used to program a touch-sensing device that includes one or more general-purpose or special-purpose processors (e.g., such as Central Processing Units, or CPUs) or equivalents thereof (e.g., such as processing cores, processing engines, microcontrollers, and the like), so that when executed by the processor(s) or the equivalents thereof, the instructions cause the device to perform the desired operations. A computer-readable medium may also include one or more mechanisms for storing or transmitting information in a form (e.g., software, processing application) that is readable by a machine (e.g., such as a device or a computer). The non-transitory computer-readable storage medium may include, but is not limited to, electromagnetic storage medium (e.g., floppy disks, hard disks, and the like), optical storage medium (e.g., CD-ROM), magneto-optical storage medium, read-only memory (ROM), random-access memory (RAM), erasable programmable memory (e.g., EPROM and EEPROM), flash memory, or another now-known or later-developed type of medium that is suitable for storing information.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A sensor array comprising:
   a substrate;
   a first plurality of receive (RX) electrodes and a second plurality of transmit (TX) electrodes, wherein the first plurality of RX electrodes and the second plurality of TX electrodes are interleaved without intersecting each other within a central area in a single layer on the substrate;
   wherein a first shaped portion of a first RX electrode, of the first plurality of RX electrodes, is connected to a first primary trace of the first RX electrode and a second shaped portion of the first RX electrode is connected to a second primary trace of the first RX electrode;
   wherein the first shaped portion and the second shaped portion of the first RX electrode are interleaved with a second TX electrode of the second plurality of TX electrodes, thereby forming a single sensor element of the sensor array;
   wherein the first primary trace of the first RX electrode is routed in a first direction on the substrate through the central area to a first edge of the central area and the second primary trace of the first RX electrode is routed in a second different direction on the substrate through the central area to a second opposite edge of the central area; and
   wherein the first primary trace of the first RX electrode is coupled to the second primary trace of the first RX electrode outside of the central area.

2. The sensor array of claim 1, wherein:
   a first secondary trace of the first RX electrode is electrically connected to the first primary trace of the first RX electrode in a first portion of the outer area corresponding to the first direction;
   a second secondary trace of the first RX electrode is electrically connected to the second primary trace of the first RX electrode in a second portion of the outer area corresponding to the second direction; and the first secondary trace and the second secondary trace are coupled to each other in the outer area.

3. The sensor array of claim 1, wherein each of the first plurality of RX electrodes comprises multiple pairs of shaped portions, the shaped portions in a pair being positioned across one of the second plurality of TX electrodes and each of the shaped portions in the pair being connected to a corresponding primary trace extending in one of the first direction or the second direction.

4. The sensor array of claim 1, wherein the first plurality of RX electrodes is disposed on the substrate in one of an X-pattern, an I-pattern, and an H-pattern.

5. The sensor array of claim 1, wherein the first shaped portion of the first RX electrode comprises at least two bars disposed in an H-pattern such that one of the at least two bars has a different width than another one of the at least two bars.

6. The sensor array of claim 1, further comprising a ground electrode disposed between the first primary trace of the first RX electrode and one or more second primary traces of one or more of the first plurality of RX electrodes different from the first RX electrode.

7. The sensor array of claim 1, wherein the first plurality of RX electrodes is disposed in multiple rows on the substrate and the second plurality of TX electrodes is disposed in multiple columns on the substrate.

8. The sensor array of claim 7, wherein the shaped portions, of a first subset of the first plurality of RX electrodes in a first row, have different widths or heights than the shaped portions of a second subset of the first plurality of RX electrodes in a second row.

9. A device comprising:
a sensor array comprising receive (RX) electrodes and transmit (TX) electrodes, wherein the RX electrodes and the TX electrodes are interleaved without intersecting each other within a central area in a single layer on a substrate of the sensor array;
wherein a first shaped portion of an RX electrode is connected to a first primary trace of the RX electrode and a second shaped portion of the RX electrode is connected to a second primary trace of the RX electrode, wherein the first shaped portion and the second shaped portion of the RX electrode are interleaved with a TX electrode, thereby forming a single sensor element of the sensor array, and wherein the first primary trace of the RX electrode is routed in a first direction on the substrate through the central area to a first edge of the central area and the second primary trace of the RX electrode is routed in a second different direction on the substrate through the central area to a second opposite edge of the central area; and
wherein the first primary trace of the RX electrode is coupled to the second primary trace of the RX electrode outside of the central area of the sensor array.

10. The device of claim 9, wherein the sensor element represents an area of the sensor array from which a distinct measurement, that represents a mutual capacitance between the RX electrode and the TX electrode, can be measured.

11. The device of claim 9, wherein, as disposed on the substrate, the first shaped portion and the second shaped portion of the RX electrode create a shield from primary traces or shaped portions of other RX electrodes.

12. The device of claim 9, wherein the sensor array is disposed in a stack-up that includes an overlay, wherein an adhesive layer attaches the overlay to one side of the substrate.

13. The device of claim 9, wherein in a particular scan operation the RX electrodes are configured to transmit scan signals and the TX electrodes are configured to measure signals that represent mutual capacitances formed between the RX electrodes and the TX electrodes.

14. The device of claim 9, further comprising a processing logic configured to perform a common mode filter operation that corrects both a common mode noise and a tail effect caused by contact from a conductive object that affects the first shaped portion of the RX electrode but does not affect one or more shaped portions of one or more RX electrodes, along the TX electrode, that are different from the RX electrode.

15. The device of claim 14, wherein the tail effect comprises a parasitic signal increase or a parasitic signal decrease that is caused by parasitic coupling between the TX electrode and one or more primary traces of the one or more RX electrodes that are different from the RX electrode.

16. A system comprising:
a capacitive sensor array comprising first receive (RX) electrodes and second transmit (TX) electrodes, wherein the first RX electrodes and the second TX electrodes are interleaved without intersecting each other within a central area in a single layer on a substrate of the capacitive sensor array;
wherein a first shaped portion of a first RX electrode is connected to a first primary trace of the first RX electrode and a second shaped portion of the first RX electrode is connected to a second primary trace of the first RX electrode, wherein the first shaped portion and the second shaped portion of the first RX electrode are interleaved with a second TX electrode, thereby forming a single sensor element of the capacitive sensor array, wherein the first primary trace of the first RX electrode is routed in a first direction on the substrate through the central area to a first edge of the central area and the second primary trace of the first RX electrode is routed in a second different direction on the substrate through the central area to a second opposite edge of the central area, and wherein the first primary trace of the first RX electrode is coupled to the second primary trace of the first RX electrode outside of the central area of the sensor array; and
a capacitance sensor coupled to the capacitive sensor array, wherein the capacitance sensor is configured to measure a plurality of measurements from the first RX electrodes, the plurality of measurements being representative of a conductive object that is in contact with the capacitive sensor array.

17. The system of claim 16, further comprising a display disposed under the capacitive sensor array, wherein the capacitance sensor is configured to perform a common mode filter operation that corrects both a tail effect caused by the contact and a noise signal caused by the display.

18. The system of claim 17, wherein:
a set of diff signals is generated based on the plurality of measurements;
the set of diff signals is corrected by the common mode filter operation; and
the set of diff signals is used to determine location coordinates of the contact.

* * * * *